(12) United States Patent
Mizuno et al.

(10) Patent No.: US 7,859,773 B2
(45) Date of Patent: Dec. 28, 2010

(54) DRIVING MECHANISM AND OPTICAL ELEMENT DRIVING APPARATUS

(75) Inventors: Makoto Mizuno, Utsunomiya (JP); Ichiro Onuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 145 days.

(21) Appl. No.: 12/029,539

(22) Filed: Feb. 12, 2008

(65) Prior Publication Data

US 2008/0204905 A1    Aug. 28, 2008

(30) Foreign Application Priority Data

Feb. 20, 2007    (JP) .............................. 2007-040005

(51) Int. Cl.
*G02B 7/02* (2006.01)
(52) U.S. Cl. .................................... 359/813
(58) Field of Classification Search .......... 359/813–824
See application file for complete search history.

(56) References Cited

U.S. PATENT DOCUMENTS

| | | | | |
|---|---|---|---|---|
| 5,383,168 A | * | 1/1995 | O'Brien et al. | 369/44.14 |
| 5,724,122 A | * | 3/1998 | Oskotsky | 355/67 |
| 5,986,827 A | * | 11/1999 | Hale | 359/822 |
| 6,930,842 B2 | * | 8/2005 | Shibazaki | 359/822 |
| 7,110,089 B2 | * | 9/2006 | Mizuno | 355/67 |
| 7,460,320 B2 | * | 12/2008 | Onuki et al. | 359/824 |
| 7,515,359 B2 | * | 4/2009 | Kugler et al. | 359/811 |

FOREIGN PATENT DOCUMENTS

| | | |
|---|---|---|
| JP | 2000-195788 | 7/2000 |
| JP | 2001-343575 | 12/2001 |

* cited by examiner

*Primary Examiner*—Ricky L Mack
*Assistant Examiner*—Vipin M Patel
(74) *Attorney, Agent, or Firm*—Canon USA Inc IP Div

(57) ABSTRACT

An optical-element driving mechanism is configured to drive an optical element, and includes a uniaxial driving mechanism that includes a linear actuator that drives in a first direction, and a link mechanism that converts a displacement in a direction orthogonal to the first direction. The linear actuator is level with the link mechanism in an optical-axis direction. The uniaxial driving mechanism is arranged in order of the link mechanism and the linear actuator in a radial direction when viewed form an optical axis of the optical element.

7 Claims, 28 Drawing Sheets

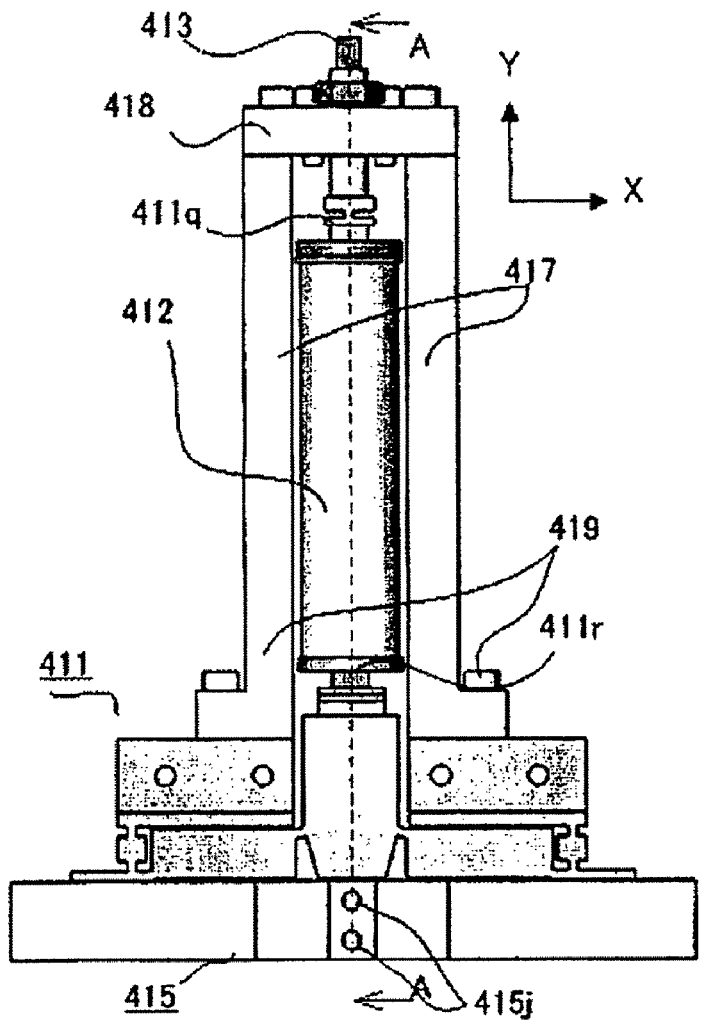
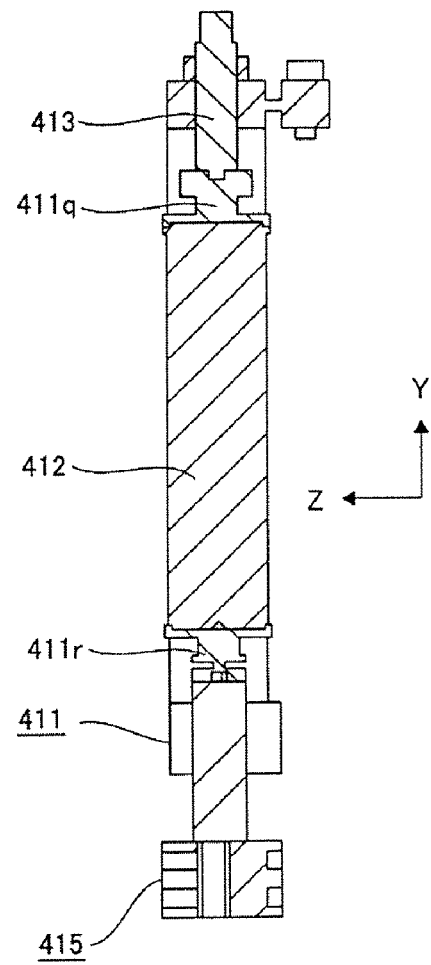
FIG. 15A
FIG. 15C
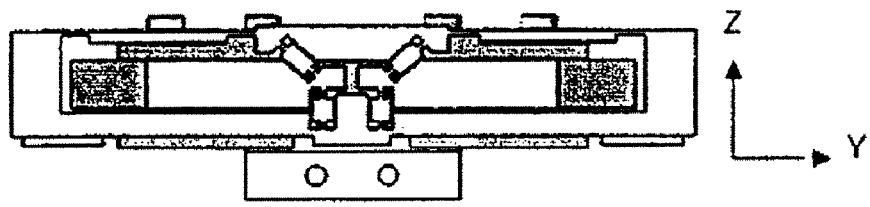
FIG. 15B

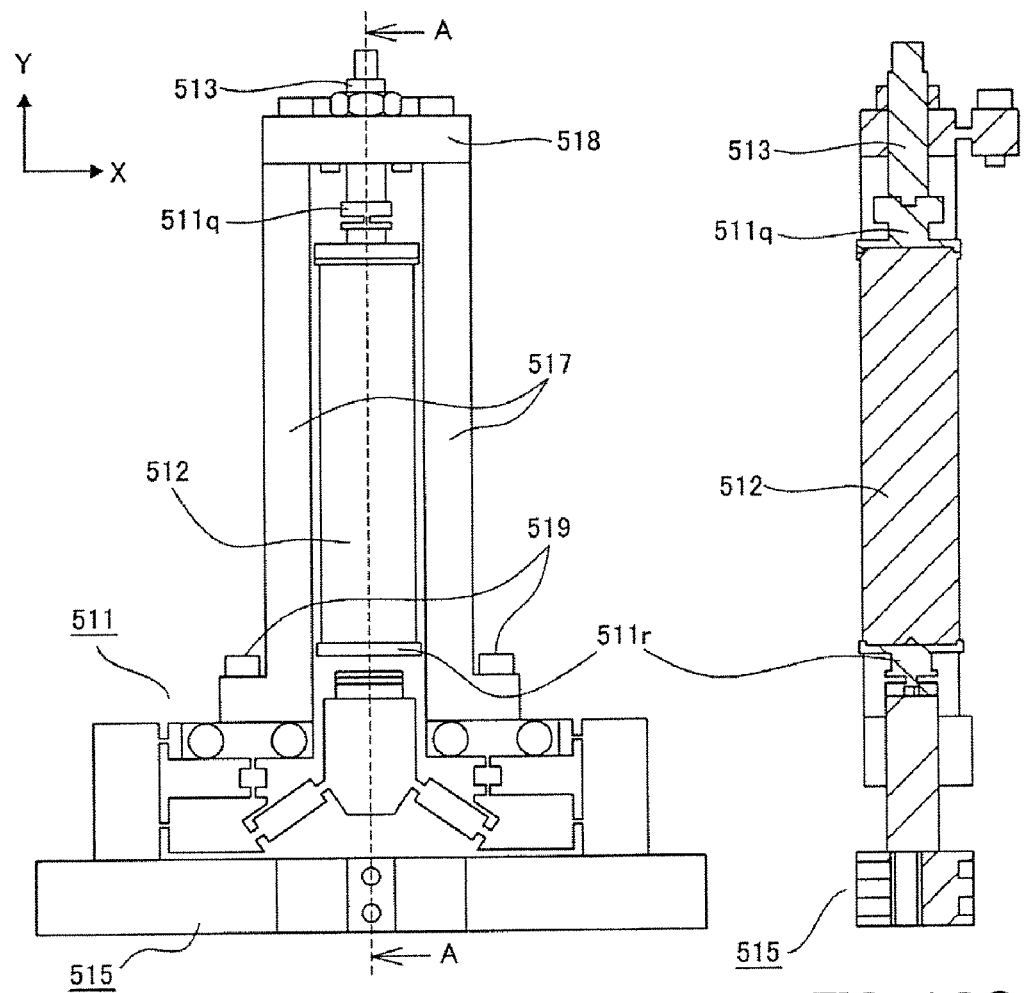
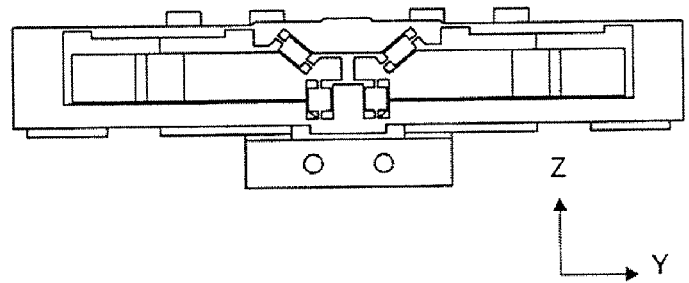
FIG. 18A  FIG. 18C
FIG. 18B

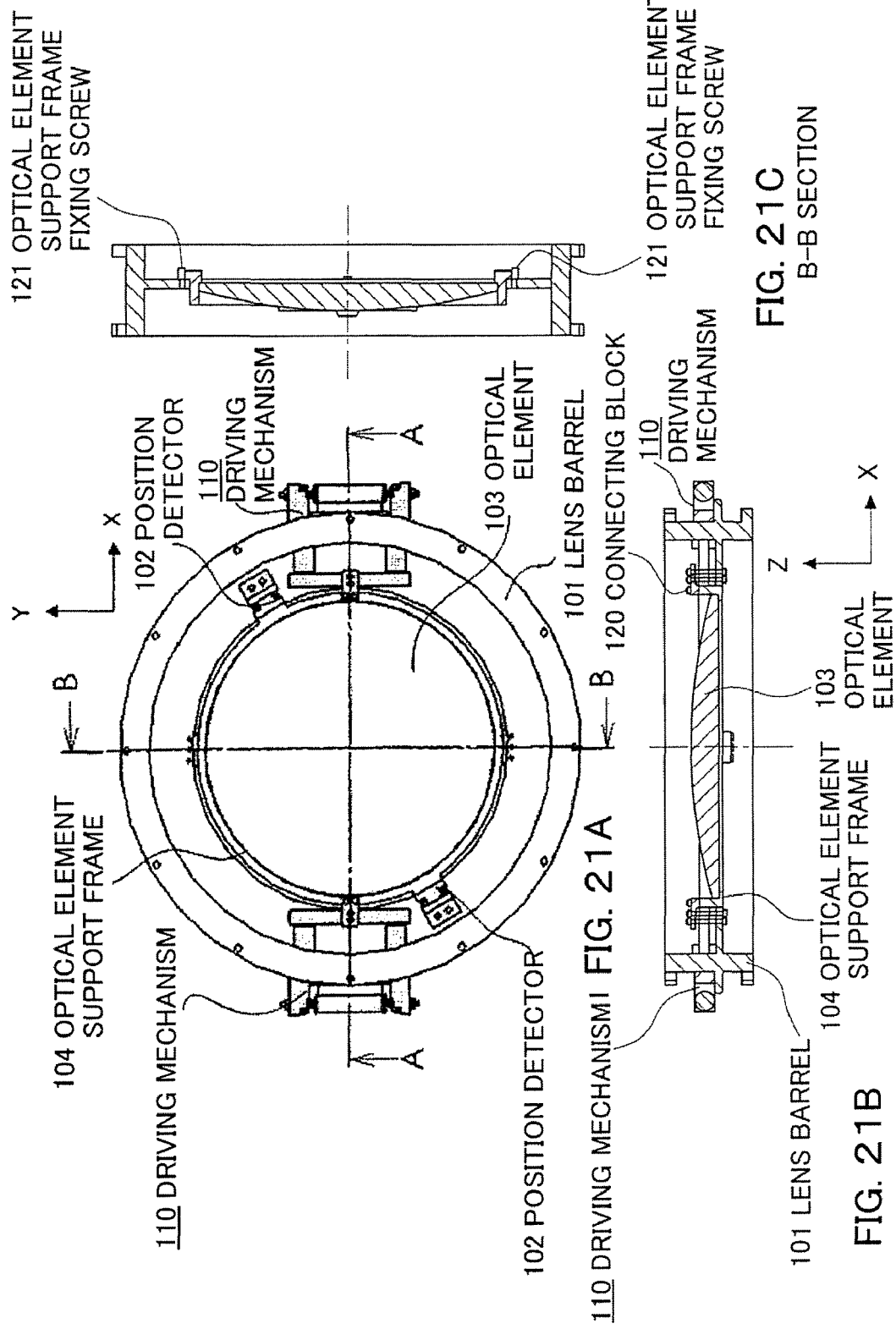

DRIVING MECHANISM AND OPTICAL ELEMENT DRIVING APPARATUS

BACKGROUND OF THE INVENTION

The present invention relates to a driving mechanism used to precisely drive a driven object using a driving means, such as a stacked piezoelectric actuator, and more particularly to an optical-element driving mechanism used to drive an optical element in a desired direction or to deform an optical element, such as a lens and a mirror, so as to obtain a more precise imaging relationship in exposing an image of a reticle (mask) onto a substrate (silicon wafer). The optical element described in the embodiments will cover a lens, a parallel plate glass, a prism, a mirror, and a diffraction optical element, such as a binary optics.

A semiconductor exposure apparatus used for a lithography process in manufacturing semiconductor devices and micro devices is an apparatus that transfers onto a substrate an original having various different types of patterns. The integrality of the semiconductor device increases year by year: In order to produce a circuit pattern with this high integrality, an aberration and distortion of a projection optical system need to be reduced.

An optical-element driving method is one method for reducing the aberration and the distortion of the projection optical system, and displaces an optical element in the projection optical system in the optical-axis direction or tilts the optical element. This method provides at least five optical-element driving units in the projection optical system, and adjusts an optical error component, a spherical aberration, a coma, a magnification error, a curvature of field, and a distortion caused by ambient changes (such as pressure and temperature variances), a variation with time, and an exposure heat. An optical-element deforming method is another method, and deforms (or corrects) a surface shape of an optical element. In this case, an optical-element driving unit adjusts a self-weight deformation of the optical element's surface that occurs in supporting or holding the optical element, or reduces the exposure aberration that occurs with a specific illumination mode.

Prior art disclose the following optical-element driving mechanism or method for a semiconductor exposure apparatus:

FIG. 2 of Japanese Patent Laid-Open No. ("JP") 2001-343575 shows an outer ring corresponding to a lens barrel, and an inner ring corresponding to a movable ring frame. That figure also shows three optical-element holding units corresponding to a lens driving mechanism arranged at angles of 120° on the outer ring, and a connecting arm that serves as an output displacement part of the driving mechanism and is coupled with the inner ring. Control over three output displacements of the driving mechanisms to desired values can shift the movable lens in the optical-axis direction, and tilt the movable lens around two axes orthogonal to the optical axis. FIGS. 12 and 13 show a detailed structure and an optional principle diagram of the driving mechanism. These figures show a mechanism that uses a piezoelectric element as a driving source, and an elastic hinge mechanism that includes a rigid link and an elastic hinge and has a displacement enlargement and guide functions, to drive the connecting arm coupled with the movable lens, in the optical-axis direction of the lens.

Prior art also disclose the following apparatus (or optical-element deforming method) that controls a surface shape of the optical element:

JP 2000-195788 discloses, in its FIG. 1, an optical-element surface-shape controlling apparatus that includes plural actuator pairs arranged in the radial direction, and a transmission that converts the actuator's power into a displacement in the optical-axis direction. In that figure, four actuators and the transmissions are arranged at regular intervals around the optical axis so that mutually facing driving parts can push or draw each other.

However, the above prior art has the following defects:

The driving mechanism disclosed in JP 2001-343575 arranges the actuator and the elastic hinge mechanism in the optical-axis direction of the lens in parallel, and thus requires such a thick outer ring corresponding to the lens barrel that it is difficult to house a mechanism in a lens unit that is thin in the optical-axis direction. The lens unit mounted with the mechanism is limited to a thick unit in the optical-axis direction, restricting the degree of freedom of the optimal reduction of the aberration of the entire projection optical system.

There is another problem: When a small generation displacement of an input source is amplified so as to obtain a large lens driving range, it is likely that the natural frequency of the system lowers, and the external vibration given to the barrel transmits to the lens. Thus, for a high imaging performance, it is difficult to use a highly sensitive lens, and a lens that requires high speed driving.

There is still another problem: The power by a driving source deforms the barrel, and displaces a sensor attachment part that measures a movable-part position. As a result, it is difficult to maintain a desired positional accuracy.

JP 2000-195788 discloses only a conceptual diagram, rather than a concrete structure, of a power-displacement converting transmission that converts the tensile force and/or the compressive force of plural actuators that are arranged in the radial direction. This structure, if viable as a unit, provides a rotational action around a pivot as well as the optical-axis direction. For example, the rotational action around a right end 12 in FIG. 2, the internal ring (2) is subject to an unintentional deformation and a precise adjustment of the optical performance becomes difficult.

BRIEF SUMMARY OF THE INVENTION

The present invention is directed to a thin driving mechanism that improves the maintainability of the driving means.

An optical-element driving mechanism according to one aspect of the present invention is configured to drive an optical element, and includes a uniaxial driving mechanism that includes a linear actuator that drives in a first direction, and a link mechanism that converts a displacement in a direction orthogonal to the first direction. The linear actuator is level with the link mechanism in an optical-axis direction. The uniaxial driving mechanism is arranged in order of the link mechanism and the linear actuator in a radial direction when viewed from an optical axis of the optical element.

A further object and other characteristics of the present invention will be made clear by the preferred embodiments described below referring to accompanying drawings.

BRIEF DESCRIPTION OF THE DRAWINGS

FIGS. 15A-C show a structure of a driving mechanism according to a fourth embodiment of the present invention.

FIGS. 18A-C show a structure of the driving mechanism according to a fifth embodiment of the present invention.

FIGS. 21A-C show an illustration that applies the driving mechanism according to a sixth embodiment of the present invention to an optical-element deforming mechanism.

DESCRIPTION OF THE EMBODIMENTS

Next follows first to tenth embodiments.

First Embodiment

The first to fifth embodiments relate to an illustration that applies a driving mechanism to a unit that displaces in an optical-axis direction or tilts it relative to the optical-axis direction.

FIGS. 1A to 5C are views relating to a first embodiment of the present invention.

Figure 1:
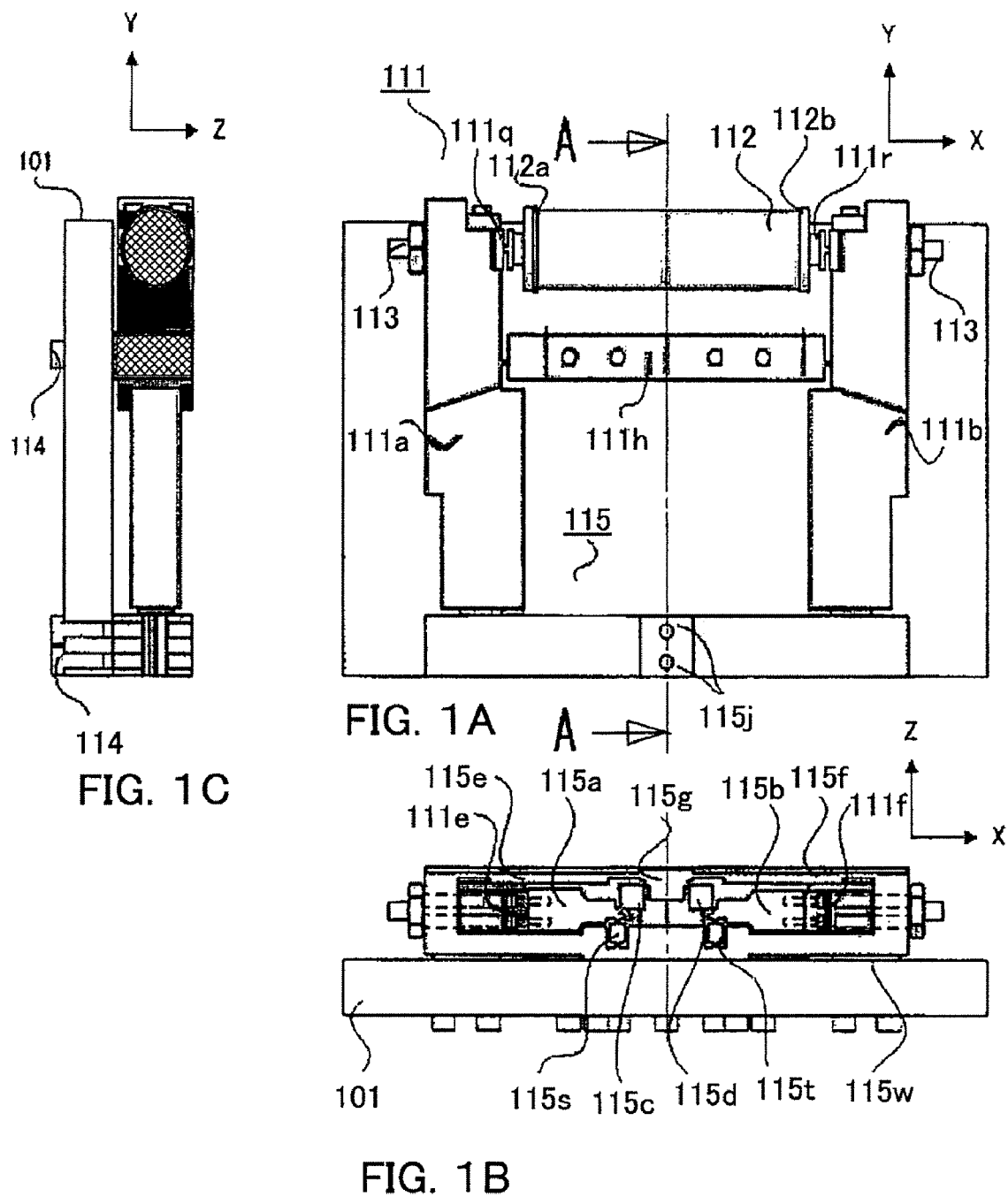
FIGS. 1A-C show a structure of a driving mechanism according to a first embodiment of the present invention.
Figure 2:
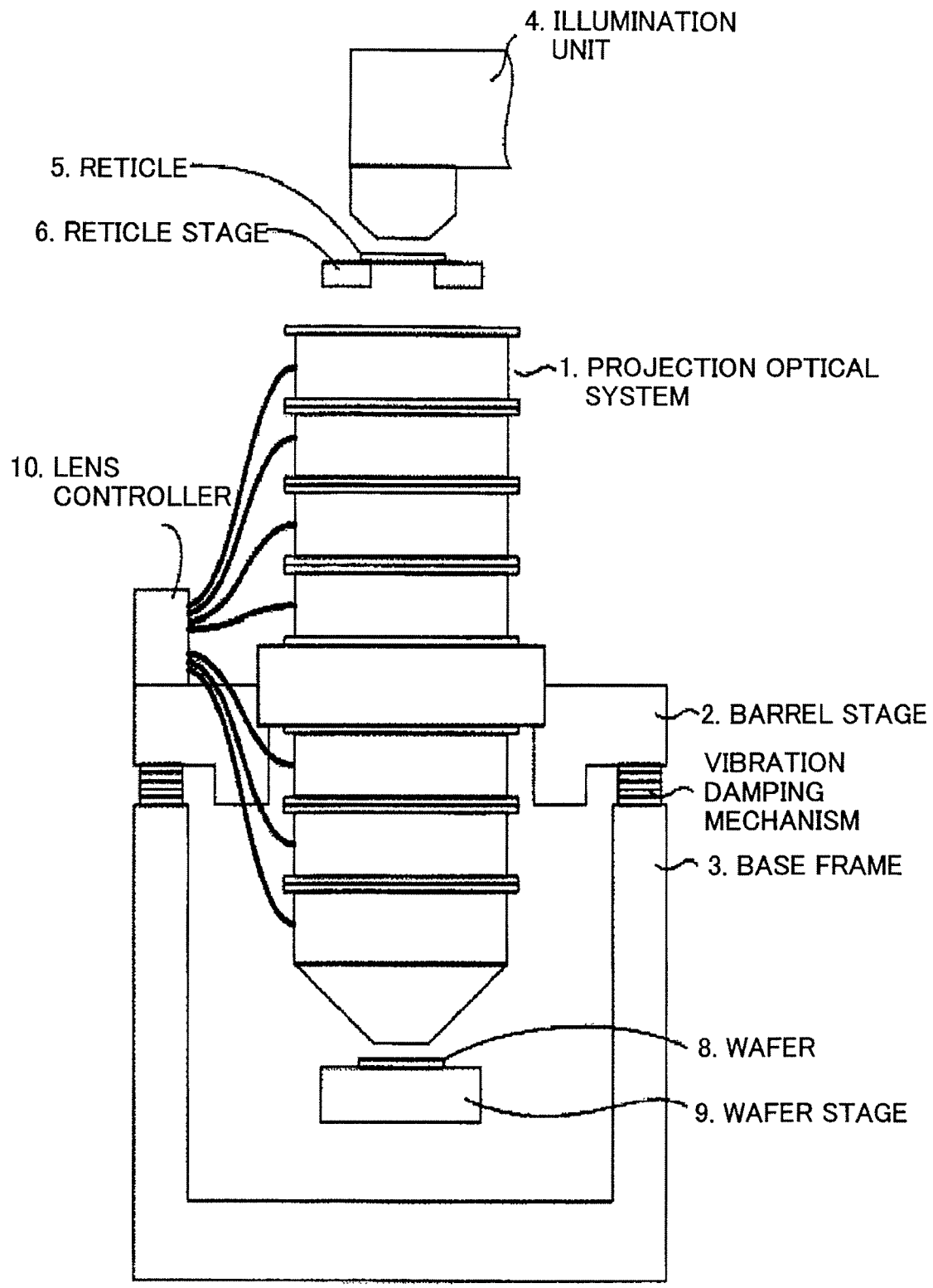
FIG. 2 shows an entire semiconductor exposure apparatus mounted with the driving mechanism according to the present invention.

FIG. 2 shows one illustrative, schematic structure of a semiconductor exposure apparatus, to which the present invention is applicable. The apparatus is a scanning exposure apparatus that scans and drives a reticle under a slit illumination, synchronously scans and drives a semiconductor wafer, and provides an exposure action. In FIG. 2, 1 denotes a projection optical system that is equipped with a driving mechanism of the present invention, and includes plural lens units each including a lens, a lens driving mechanism, and a lens barrel that accommodates them.

A barrel support 2 is coupled to a base frame 3 via a vibration damping mechanism so that the installation floor vibration does not reach the projection optical system 1 or each lens in the projection optical system 1. 4 denotes an illumination unit configured to illuminate the reticle 5 as an original at various illumination modes. 6 denotes a reticle stage that scans and drives the reticle.

8 denotes a semiconductor wafer (wafer) on which a photosensitive agent is applied. 9 denotes a wafer stage that holds the wafer. The wafer stage 9 adjusts a position of the wafer 8 in the optical-axis direction, and controls scanning of the wafer in synchronization with the scanning action of the reticle stage 6. 10 is a lens controller controls the inventive optical-element driving mechanism according to the predetermined control flow. More specifically, the optical performance of the projection optical system 1 is optimized by adjusting and driving a predetermined lens based on a previously stored program and a calculation result based on various pieces of sensor information, such as a barometric pressure sensor. A detailed description will be given with reference to FIGS. 7 and 8.

Figure 3A:
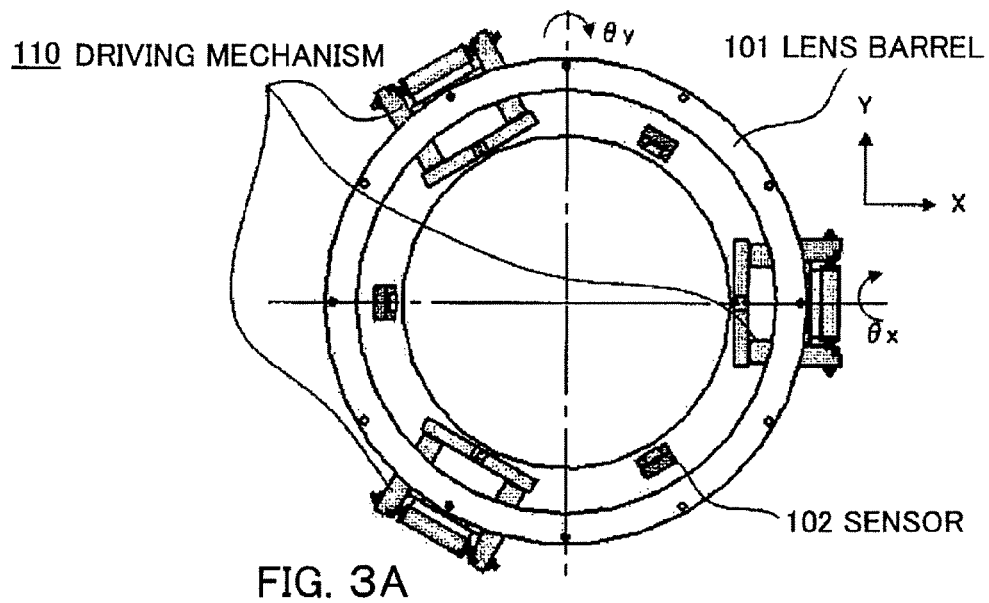
FIGS. 3A-C show the driving mechanism of the present invention applied to the lens driving unit.
Figure 3B:
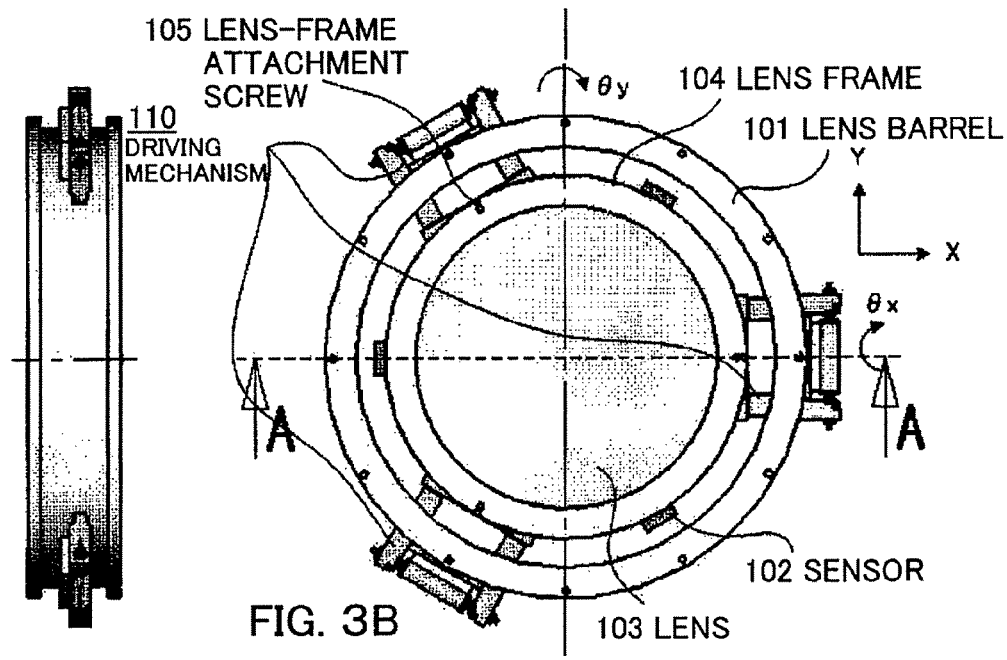
Figure 3C:
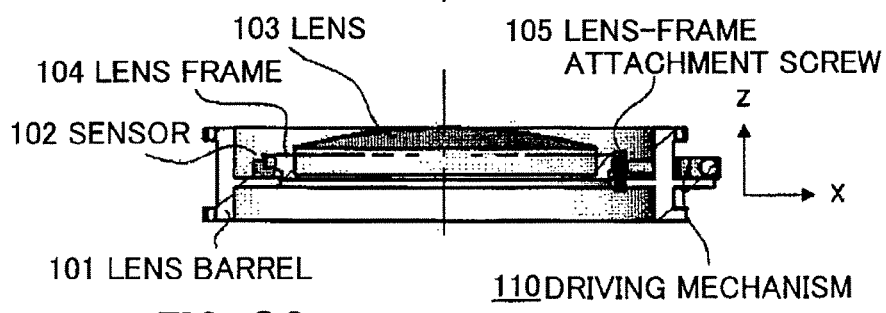

FIGS. 3A-C show plural driving mechanisms according to the present invention, an optical-element driving apparatus that includes the driving mechanisms and can drive a lens in a desired direction. FIG. 3A is a plane view that removes the lens and lens frame (support member). FIG. 3B is a plane view that mounts the lens and lens frame. FIG. 3C is an A-A sectional view. In FIGS. 3A and 3C, 101 denotes a lens barrel that includes a flat part that fixes the driving mechanism and the sensors, which will be described later, and a sidewall cylinder that are connectable to upper and lower adjacent other lens units. 110 denotes the driving mechanisms according to the present invention, and three sets of same driving mechanisms are mounted onto the bottom flat part of the lens barrel 101. 102 denotes a sensors that detect a displacement in the optical-axis direction and a displacement in a radial direction orthogonal to the optical axis of the lens frame, which will be described later, and may use an interferometer type distance measuring unit using a semiconductor laser, a electrical capacitance sensor, a linear encoder, a differential transformer displacement sensor, and an eddy-current displacement sensor.

FIG. 3B shows the lens and lens frame. The lens frame 104 accommodates the lens 103, and has six notches. Output displacement parts of three driving mechanisms 110 are fastened by the lens frame attachment screws 105 in the three out of plural notches. Spacers (not shown) is provided between the driving mechanisms and the lens frame, and makes the heights of these three driving mechanisms equal to each other, thereby preventing a transmission of an unnecessary deformation to the lens. The other three notches are used as a target to detect a displacement of the lens frame. FIG. 3C shows this state. FIG. 3C shows an illustration when a laser interference type displacement sensors are used as the sensors 102. Detection laser beams are projected in the optical-axis direction of the lens 103, and used to detect three displacements of the lens frame 104 in the optical-axis direction (Z direction) from the interference information of the reflected lights. In the above structure, when the three sets of driving mechanisms 110 are driven by equivalence, the lens 103 can be driven in parallel in the optical-axis direction or in the Z-axis direction shown in FIG. 3C. When the three sets of displacements are provided with a predetermined difference, tilt driving is available in θx and θy directions as shown in FIG. 3B. In that case, when output of the sensors 102 in the optical-axis direction are fed back, a parallel movement and tilt displacement of the lens 103 can be precisely controlled. A shift amount of an image associated with decentering can be calculated on a plane orthogonal to the optical axis of the lens 103 by monitoring an output of the sensors 102 in the radial direction. An alignment error of the reticle image associated with the lens decentering is cancelled by adding the calculation result to the displacement of the wafer stage shown in FIG. 2. The optical-element driving mechanism of this embodiment uses the lens as an optical element, but can use another optical element, such as a concave mirror and a plane mirror.

When the above, plural (e.g., three) sensors 102 may be arranged so as to measure a displacement in the radial direction, and may be used to measure a displacement of the lens 103 in the X and Y directions. X and Y displacements of the mechanisms that can only drive in triaxial directions are generally detrimental for the optical performance. Therefore, a further improvement of the imaging performance can be expected by measuring a displacement, by correcting the displacement through driving of another optical element or through driving of the wafer and the reticle. FIGS. 3A-C arrange the sensors 102 so as to measure displacements both in the Z direction and in the radial direction. Three Z-direction sensors and three radial-direction sensors can measure lens positions in and around three orthogonal axes.

Figure 4A:
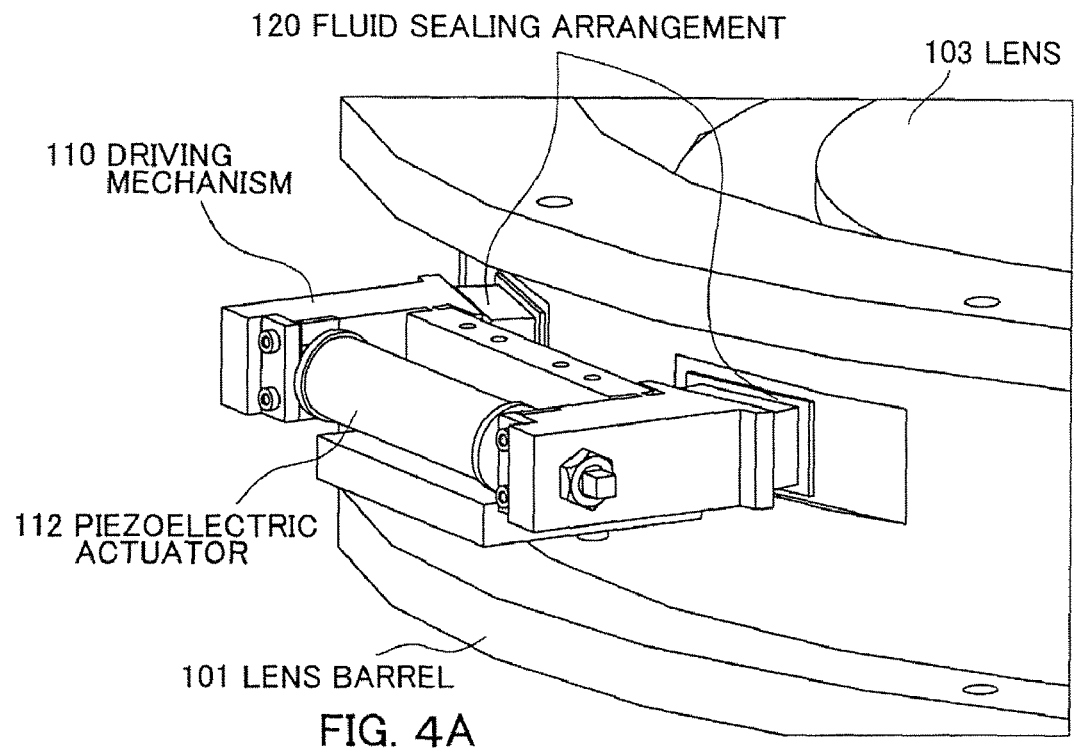
FIGS. 4A-B show a sealing method of the driving mechanism according to the present invention.
Figure 4B:
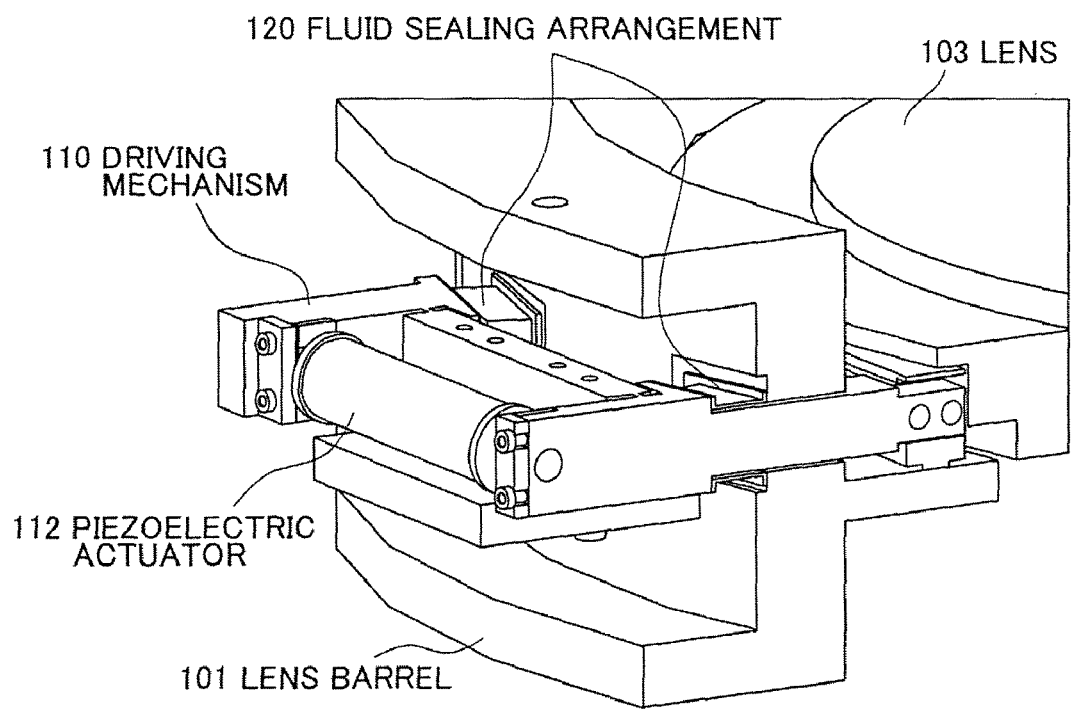

FIGS. 4A-B show a sealing method of the driving mechanism 110 that perforates the lens barrel 101. FIG. 4A is a perspective view, and FIG. 4B is a sectional and perspective view. In the projection optical system in the semiconductor exposure apparatus, the inside of the barrel is often purged with a gas, such as nitrogen, and shielded from the outside air in order to protect the optical element from contaminations and the gas generated from various sites. In this embodiment where the driving mechanism 110 perforates the lens barrel 101, any openings in the side surface of the lens barrel 101 would make sealing difficult. Accordingly, the fluid sealing arrangement 120 is located between the lens barrel 101 and the driving mechanism 110 to shield the fluid. The fluid sealing arrangement 120 preferably uses a flexible member, such as rubber, which is unlikely or less likely to outgas so as to maintain the operation of the driving mechanism 110. FIGS. 4A-B secure the lens barrel 101 with the driving mechanism 110 by adhering the fluid sealing arrangement 120 to the lens barrel 101 and the driving mechanism 110, but may use a metal component (flange) for fixture.

Another conceivable means for sealing the barrel is to attach to each driving mechanism 110 a cover that covers a perforation of the lens barrel 101. This method is viable with a space allowance around the barrel.

FIGS. 1A to 5C and 6 relate to the first embodiment of the present invention.

FIGS. 1A-C are driving-mechanism detailed views according to the present invention, or shows a detailed structure of the driving mechanism 110 shown in FIG. 3. FIG. 1A is a plane view when the lens is viewed from the top in the optical-axis direction, and defines the X axis and Y axis. FIG. 1B is a side view when the lens is viewed from the lens center, and defines the X axis and Z axis. FIG. 1C is a sectional view taken along an A-A line in FIG. 1B.

In the above figures, 101 denotes a flat part of the lens barrel shown in FIG. 3. 111 denotes a driving mechanism body, and constitutes a link mechanism formed by wire electric discharge and milling from a monolithic metal block. 112 is a stacked piezoelectric actuator, sealed in a closed cylindrical vessel having a stretchable driving source in which electrostrictive strain elements and electrodes are alternately stacked. The overall length of the actuator 112 in the X-axis direction increases approximately in proportion to the applied voltage. 113 is an adjustment screw that corrects a size error of the actuator 112, and preloads the actuator 112. The adjustment screw 113 is inserted between the driving mechanism body 111 and the actuator 112. A nut fixes the adjustment screw. 114 denotes a driving-mechanism attaching screw that screws the driving mechanism body 111 onto the lens barrel 101. As shown in FIG. 1C, the direction conversion member 115 is attached to the lens barrel 101 at three points 115W at its bottom surface. This structure intends to prevent a position detecting error that would occur as a result of that the driving force by the actuator transmits to the lens barrel, the barrel slightly deforms, and the attachment surface of the sensors 102 deforms. When the rigidity of the lens barrel 101 is sufficiently high due to its thick flat part or another reason, the influence on the sensors (ex. position detection error) lowers. Then, the direction conversion member 115 may be fastened so that it contacts the lens barrel 101 over the entire bottom surface of the direction conversion member 115. Coupling between the driving mechanism body 111 and the barrel will be discussed later.

Figure 5A:
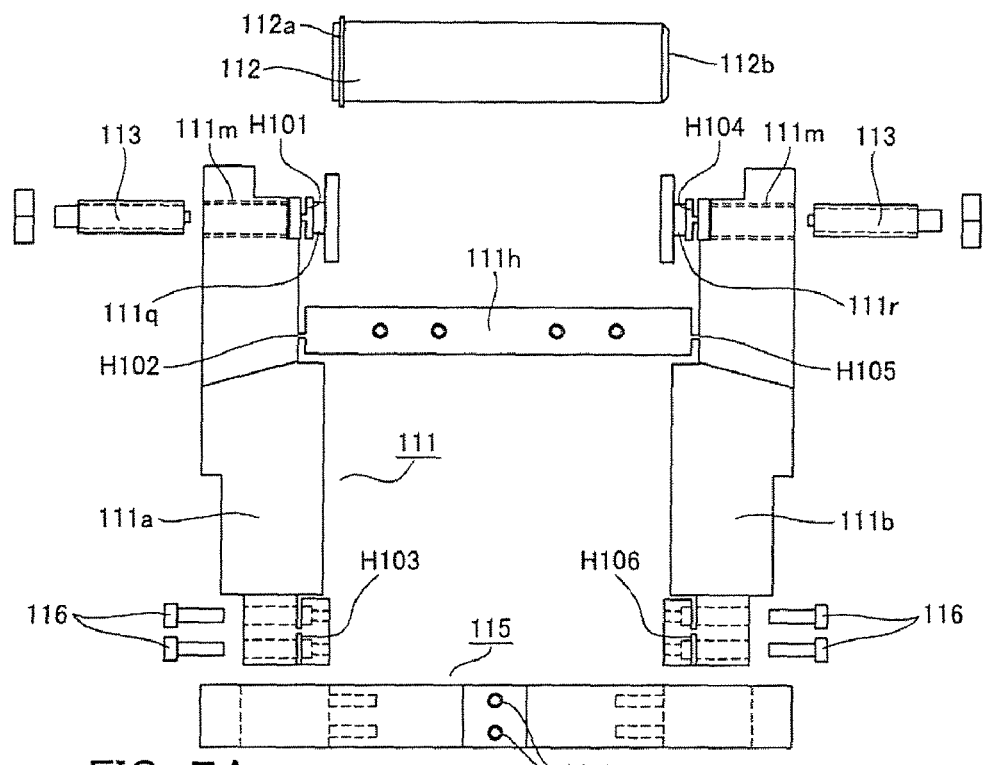
FIGS. 5A-C show a detailed structure of the driving mechanism according to the first embodiment of the present invention.
Figure 5B:
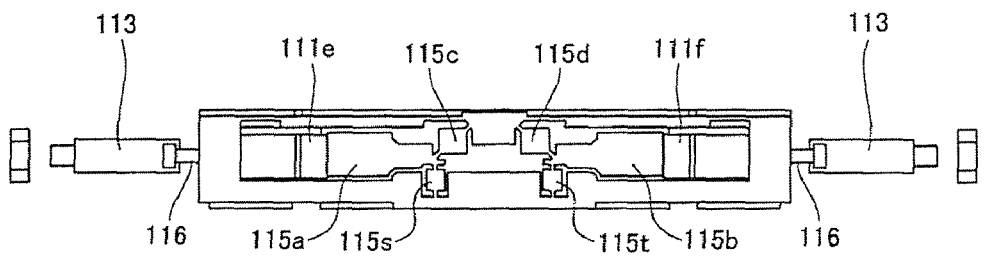
Figure 5C:
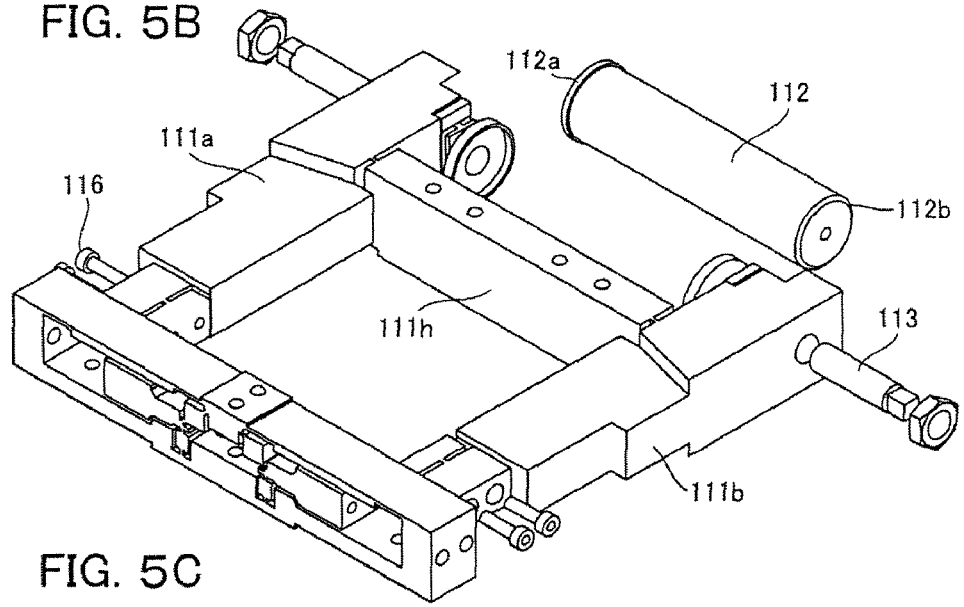

FIGS. 5A-C are exploded views of the driving mechanism body 111, the direction conversion member 115, the piezoelectric actuator 112, the adjustment screw 113, and conversion-member coupling screws 116. FIG. 5A is a plane view, FIG. 5B is a side view, and FIG. 5C is a perspective view. Referring to FIGS. 5A-C, a description will be given of a manufacturing method of the driving mechanism body 111 and the direction conversion member 115.

The driving mechanism body 111 is made from a plate metal block as a base material having a predetermined thickness, and an outer shape of the link mechanism shown in FIG. 5A is formed through wire electric discharge and milling. Next, a borer is used to make a circular tapped-hole of a fixture link 111*h*, and then a bottom hole of an attachment tapped-hole and an escape tapped-hole from the arm side surfaces at both sides. Finally, an adjustment tapped-hole 111*m* for the adjustment screw 113 is made, and the process is completed.

The direction conversion member 115 is made from a plate metal block as a base material having a predetermined thickness, and an outer shape and a slit of the link mechanism shown in FIG. 5B are made through wire electric discharge and milling. Next, a borer is used to form a bottom hole of a lens-frame attaching tapped-hole 115j shown at the center of FIG. 5A, and then a bottom hole of an attachment tapped-hole and an escape tapped-hole from side surfaces at both sides. Finally, the lens-frame attaching tapped-hole 115j and the horizontal links 115a and 115b are made, and the process ends.

Referring now to FIGS. 1A-C and 5A-C, a description will be given of an assembly procedure of the driving mechanism of the first embodiment. Initially, in the perspective view of FIG. 5C, both side arms of the driving mechanism body 111 are inserted into a pair of windows in the direction conversion member 115, and both are coupled with the conversion-member coupling screws 116. Next, the piezoelectric actuator 112 is mounted into the driving mechanism body 111 via piezoelectric receiver links 111q and 111r. Next, a pair of adjustment screws 113 are pushed into the piezoelectric adjustment tapped-holes 111m from the outside of them to press the ends 112a and 112b of the piezoelectric actuator 112 at both sides against the piezoelectric receiver links 111q and 111r. The penetration amount by each adjustment screw 113 is approximately proportional to the preload amount of the piezoelectric actuator, and a rising amount of a lens-frame driving link 115g in the Z-axis direction may be adjusted to a desired amount with a height measurement instrument, such as a dial gauge. When three driving mechanisms are incorporated as shown in FIGS. 3A-C, characteristic scattering among them can be eased. A nut is preferably used for fastening so as to prevent loosening of the piezoelectric adjustment screw. This ends loading of the piezoelectric actuator 112. One adjustment screw 113 at one of the piezoelectric receiver links 111q and 111r can be enough for an adjustment. For the accuracy of the motion, each pair of three elastic hinges H101-H102-H103 and H104-H105-H106 at right and left sides of the driving mechanism body 111 is preferably aligned with the Y axis. Thus, a pair of adjustment screws 113 is preferably used for both sides of the piezoelectric actuator for easy adjustments. Finally, the link mechanism is screwed onto the lens barrel 101 using the driving-mechanism attaching screw 114, and thus the assembly is completed.

Figure 6A:
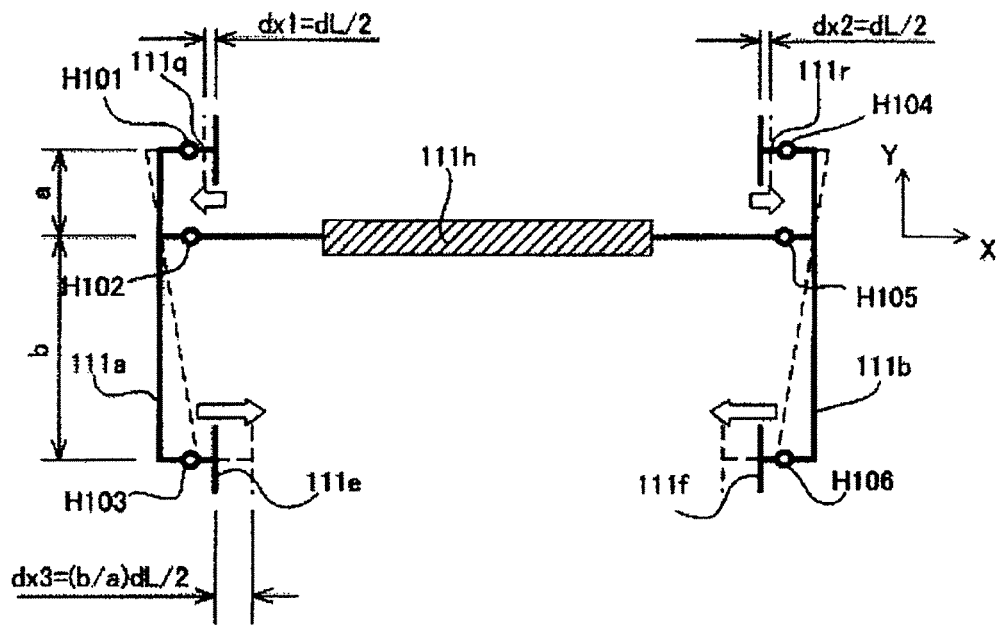
FIGS. 6A-B are views for explaining an operation of the driving mechanism according to the first embodiment of the present invention.
Figure 6B:
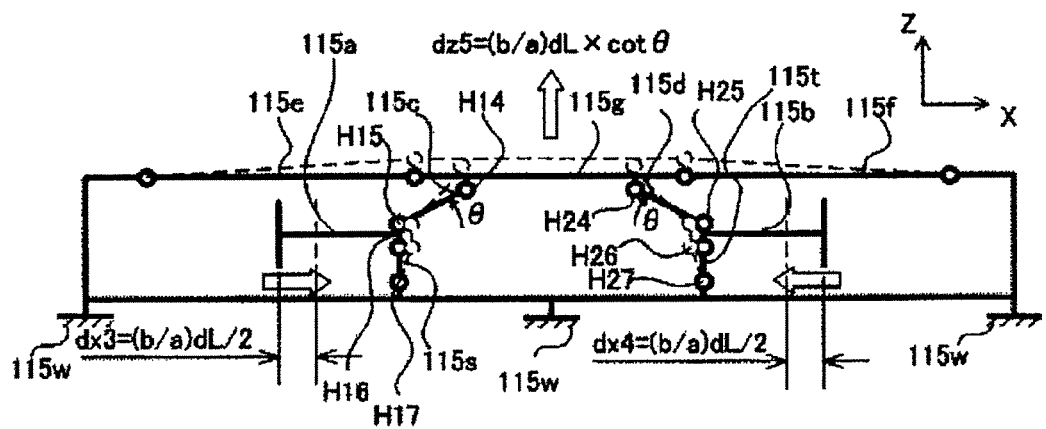

FIGS. 6A-B are views for explaining a link operation of the driving mechanism body 111, where the driving mechanism body 111 schematizes the plane view of FIG. 5A, and the direction conversion member 115 schematizes the side view of FIG. 5B. Referring now to FIGS. 5A to 6B, a description will be given of an operational principle of the driving mechanism of the first embodiment.

When the predetermined voltage is applied to two electrode terminals (not shown) of the piezoelectric actuator 112, an overall length L of the piezoelectric actuator 112 is expanded by dL in the X-axis direction. Then, as shown in FIG. 6A, one piezoelectric receiver link 111q displaces by $dX1=dL/2$ in the left direction and the other piezoelectric receiver link 111r displaces by $dx2=dL/2$ in the right direction. Then, displacement attachment links 111a and 111b that are configured rotatable around elastic hinges H102 and H105, and extend in the Y-axis direction rotates by a predetermined fine angle around the Z axis. Therefore, a connecting link 111e displaces by dX3, and a connecting link 111f displaces by dX4. When FIG. 6A defines the lengths of the links 111a and 111b, the displacement amounts of the connecting links 111e and 111f in the X-axis direction are about b/a times as much as the displacement amounts dx1 and dx2 of the piezoelectric receiver links 11q and 111r. This magnification is referred to as a geometric magnification, and defined as α. The geometric magnification α lowers due to the deformations of the displacement pickup links 111a and 111b and the stretches of the elastic hinges, causing a driving loss. Therefore, a shape design of the link should be fully noticed.

The displacements of the connecting links 111e and 111f in the X-axis direction are transmitted to horizontal links 115a and 115b of the direction conversion member 115. The direction conversion links 115c and 115d that incline by an angle θ with respect to the X axis rotate, moving up the lens-frame driving link 115g by dZ5 in the Z-axis direction. The displacement dZ5 in the Z-axis direction is a displacement is about cot θ times as much as an average value of the displacements of the horizontal links 115a and 115b. This magnification is referred to as a geometric magnification of the direction conversion member 115, and defined as β.

A geometric magnification γ of the entire mechanism that combines the driving mechanism body 111 and the direction conversion member 115 with each other can be expressed as a product between the geometric magnifications of both mechanisms, i.e., $\gamma=\alpha\times\beta$. It is preferable to set a large value to α and/or β in order to take a large displacement of an optical element in a wide range from a slight displacement dL of the piezoelectric actuator 112. In order to keep α large, it is necessary that the shape parameter "a" of the displacement pickup links 111a and 111b is made small, and the shape parameter "b" of them is made large. In order to keep β large, θ of the displacement pickup links 111a and 111b needs to be small. A large "b" would increase (a diameter of) the lens barrel 101, and thus would cause a design restriction. On the other hand, a large magnification ratio would lower the natural frequency of the driving mechanism 110, and thus a care should be taken. For example, the vibration outside the barrel transmits the lens 103, degrading the image performance, and lowering the driving speed. For the vibration characteristic of this mechanism that intends to drive the lens as an optical element, γ is preferably set between 0.7 inclusive and 2 inclusive. From the space in the Z-axis direction, angles between the X axis and the direction conversion links 115c and 115d of the direction conversion member 115 are preferably set between 30° and 60°. In this case, the geometric magnification β is set between about 0.57 and about 1.72.

Thus, the lens-frame driving link 115g displaces in the Z direction as the piezoelectric actuator 112 expands and shrinks, and it is preferable that the link displaces only in the Z-axis direction and does not displace in the X or Y direction. For this characteristic, the following supplemental link is provided. The support links 115e and 115f are connected to both left and right sides of the lens-frame driving link 115g so as to restrict a movement of the lens-frame driving link 115g in the X-axis direction. These support links provide the lens-frame driving link 115g with a degree of freedom of displacement in the Z-axis direction, restricting the degree of freedom in the X-axis direction. In addition, other support links 115s and 115t restrict a movement of the lens-frame driving link 115g in the Y-axis direction. These support links are provided near the centers of the horizontal links 115a and 115b, maintain the degree of freedom of the horizontal link in the X-axis direction, and restrict the degree of freedom in the Y-axis direction. Accordingly, the restriction effect of the horizontal links 115a and 115b in the Y-axis direction is transmitted to the lens-frame driving link 115g via the direction conversion links 115c and 115d. This structure allows an area of the tapped hole 115j of the lens-frame driving link 115g to displace only in the Z-axis direction, and restricts its degree of freedom of movement in each of the X and Y directions. Therefore, the lens frame 104 can be precisely driven in the Z-axis direction.

The driving mechanism body 111 in the mechanism of this embodiment has the displacement pickup links 111a and 111b that can rotate around the elastic hinges H102 and H105. Therefore, the horizontal links 115a and 115b of the direction conversion member are likely to slightly displace in the Y-axis direction, and the lens-frame driving link 115g is likely to displace in the Y-axis direction. The above supplemental links can mitigate this action but may not be enough depending upon the required driving accuracy. Such a displacement in a direction other than the Z-axis direction causes deformation of the lens frame 104 and the lens, possibly resulting in a detrimental component that deteriorates the optical performance. It is therefore preferable that the lens-frame driving link 115g in the Y-axis direction is restrained as small as possible.

Figure 9A:
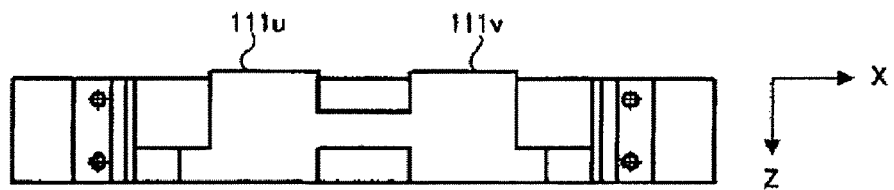
FIGS. 9A-C show a detailed structure of the driving mechanism according to the first embodiment of the present invention.
Figure 9B:
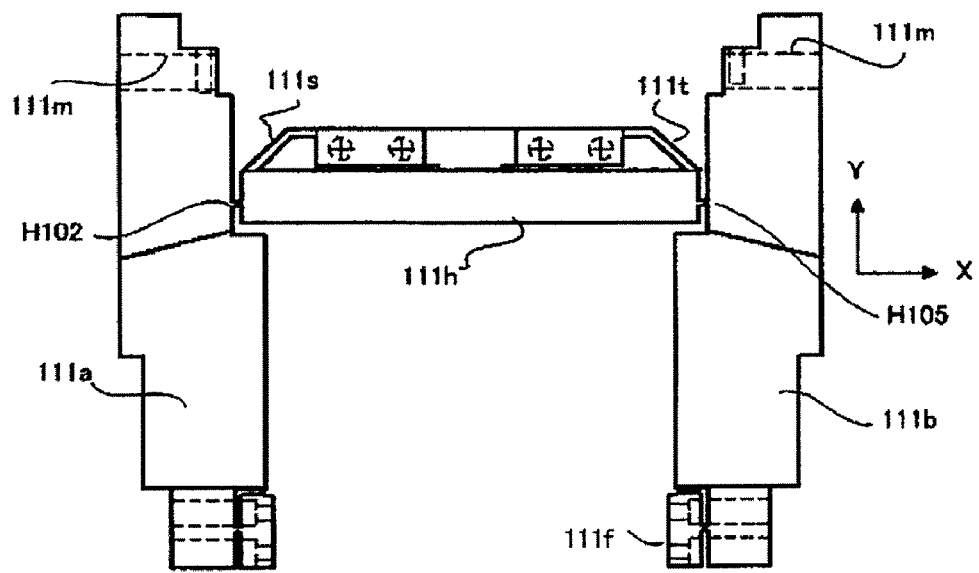
Figure 9C:
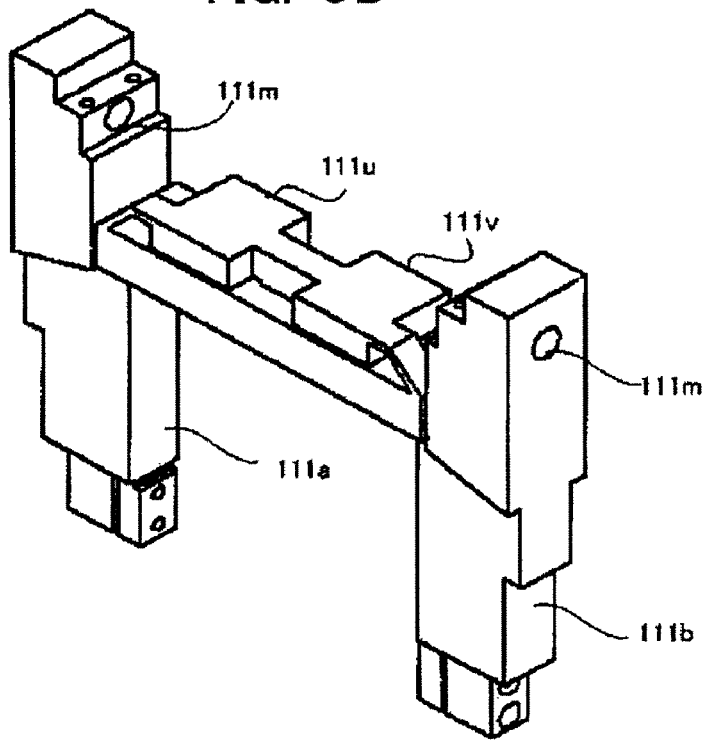

For this purpose, it is effective to provide an additional supplemental link shown in FIGS. 9A-C to the fixture link 111h. It is coupled with the lens barrel 101 at bottom parts of new fixture parts 111u and 111v rather than the bottom part of the fixture link 111h. The fixture parts 111u and 111v are coupled with the fixture link 111h via flat spring parts 111s and 111t that extend the center, the left and the right parts above the fixture link 111h. The elastic hinges H102 and H105 are slightly shifted in the Y-axis direction from the center of the fixture link 111h. This additional supplemental link enables the fixture link 111h to deform (or bends in the Y-axis direction), and to translate in the Y-axis direction, reducing the displacements of the connecting links 111e and 111f in the Y-axis direction. The optimization of a shift amount of each of the elastic hinges H102 and H105 from the center of the fixture link 111h and the shape parameters of the flat springs 111s and 111t would be effective to minimize motions of the lens-frame driving link 115g in the Y-axis direction.

Figure 10:
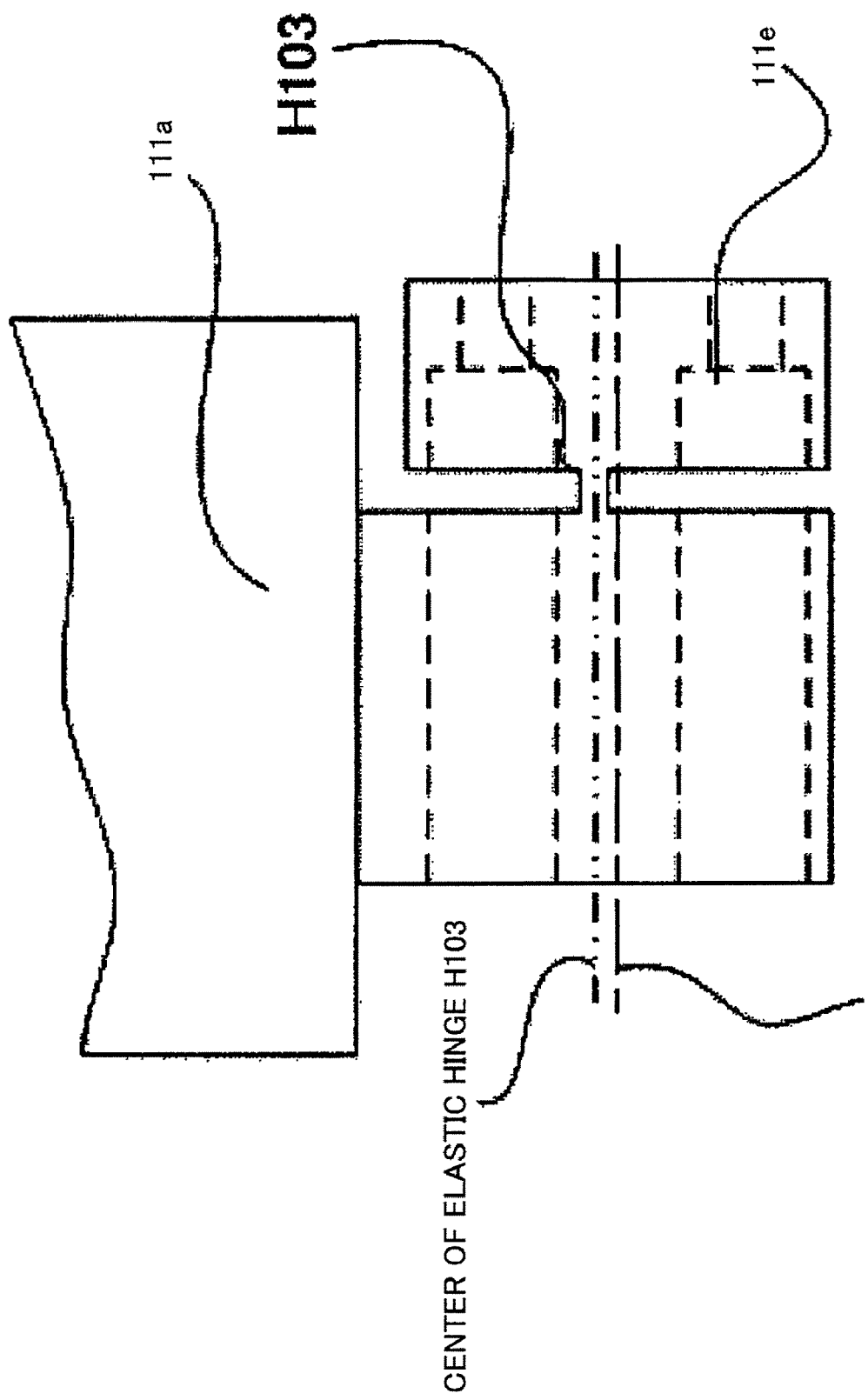
FIG. 10 is a partially enlarged view of the first embodiment of the present invention.

FIG. 10 is a partially enlarged view around the connecting link 111e of the driving mechanism body 111. The lens-frame driving link 115g can be displaced in the Y-axis direction by slightly shifting the elastic hinge H103 (which is replaced with the elastic hinge H106 (not shown) for the opposite side) from the center of the connecting link 111e in the Y-axis direction. The elastic hinge H106 should be similarly coordinated. The connecting link 111e has a hole for conversion-member coupling screw (not shown), and the shift amount is restricted.

Figure 11A:
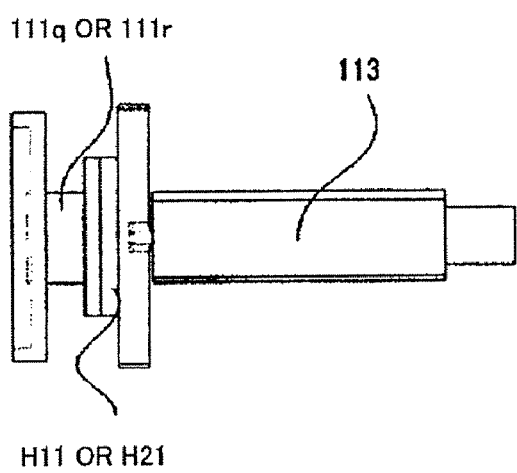
FIGS. 11A-B are a detailed view of the piezoelectric receiver according to the first embodiment of the present invention.
Figure 11B:
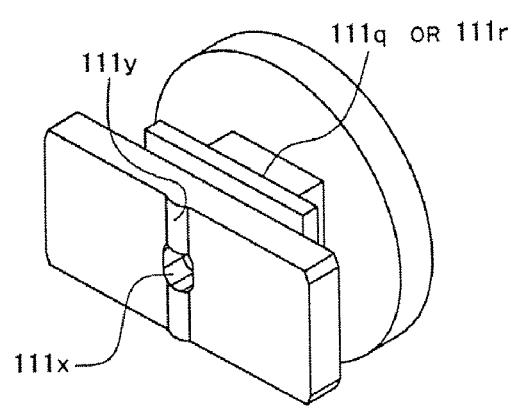

The piezoelectric actuator 112 is likely to get damaged upon a bending moment. According to the mechanism of this embodiment, the elastic hinges H101 and H104 mitigate a moment around the Z axis. FIGS. 11A-B show details of the piezoelectric receiver links 111q and 111r and the adjustment screw 113. The adjustment screw 113 has a cylindrical projection at its tip, which is inserted into a hole 111x in the piezoelectric receiver link for positioning. In order to reduce a moment around the Y axis, the piezoelectric receiver links 111q and 111r at the adjustment screw 113 are processed into the cylindrical shapes (111y). Thus, it is ideal that both components linearly contact each other, achieving the purpose of mitigating a moment around the Y axis.

Figure 7:
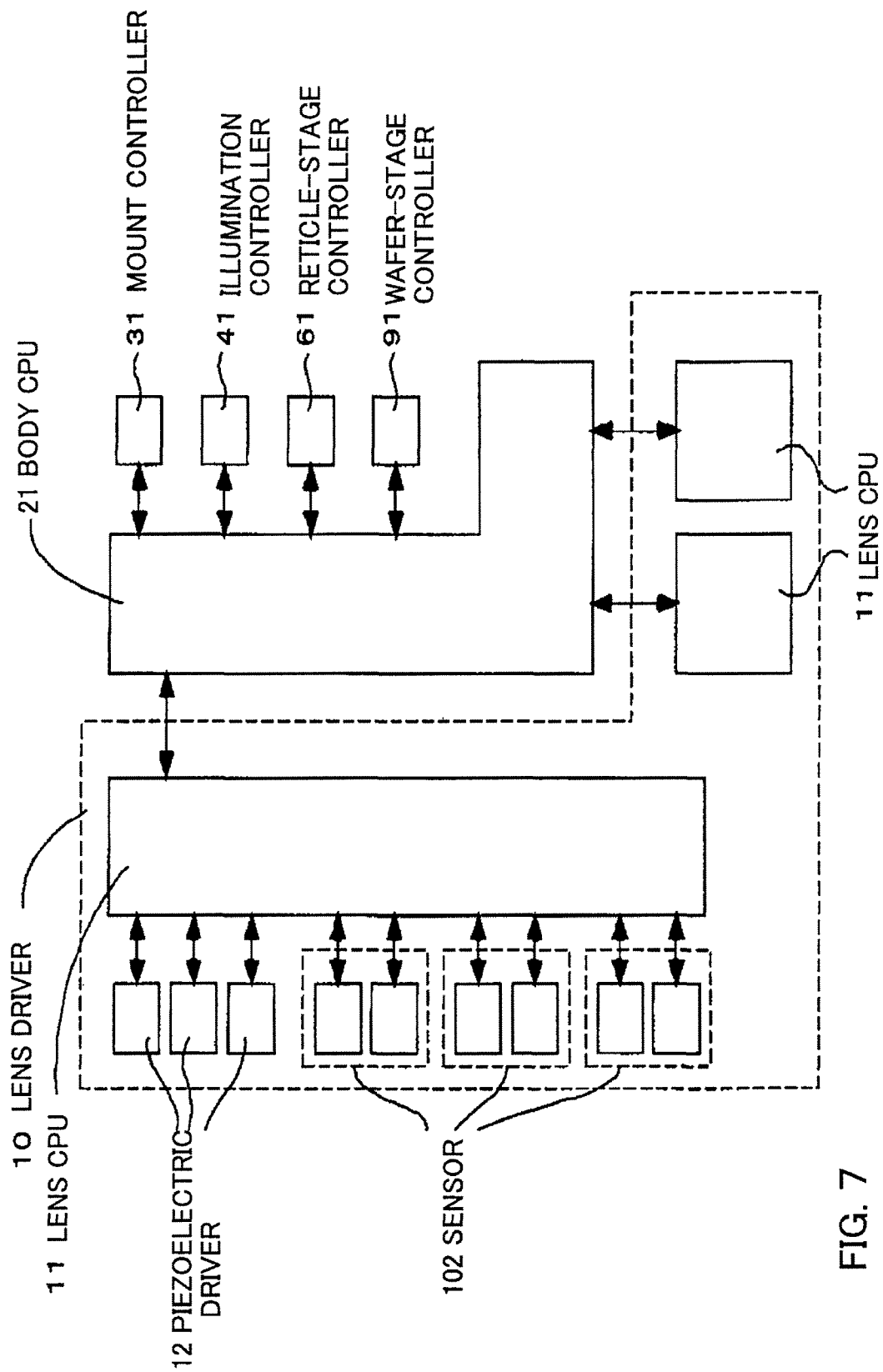
FIG. 7 is a control block diagram of an optical-element driving unit according to the present invention.

FIG. 7 is a control block diagram for controlling an exposure action and a lens driving action of the semiconductor exposure apparatus shown in FIG. 2. 21 denotes a body CPU that controls actions of the entire exposure apparatus. 31 denotes a mount controller that controls vibration damping of the base frame 3. 41 denotes an illumination controller that controls an illumination mode and the dose of the illumination unit. 61 denotes a reticle-stage controller that provides driving control over the reticle stage. 91 denotes a wafer-stage controller that provides driving control over the wafer stage 9.

10 is a lens controller, and has plural lens CPU 11. Each lens CPU 11 provides driving control over one lens shown in FIG. 3. Each lens CPU 11 is connected to three piezoelectric drivers 12, and each piezoelectric driver drives each piezoelectric actuator 112 installed in the three sets of driving mechanism shown in FIG. 3.

Each lens CPU 11 is connected to three or six sensors 102. Each sensor 102 corresponds to one shown in FIG. 3. Among the six sensors, three sensors 102 detect a displacement of the lens frame 104 in the optical-axis direction or the Z-axis direction, and the remaining three sensors 102 detect a position of the lens frame 104 in the radial direction, if necessary. Each of the remaining lens CPUs 11 also is connected to the piezoelectric driver and the sensor.

Figure 8:
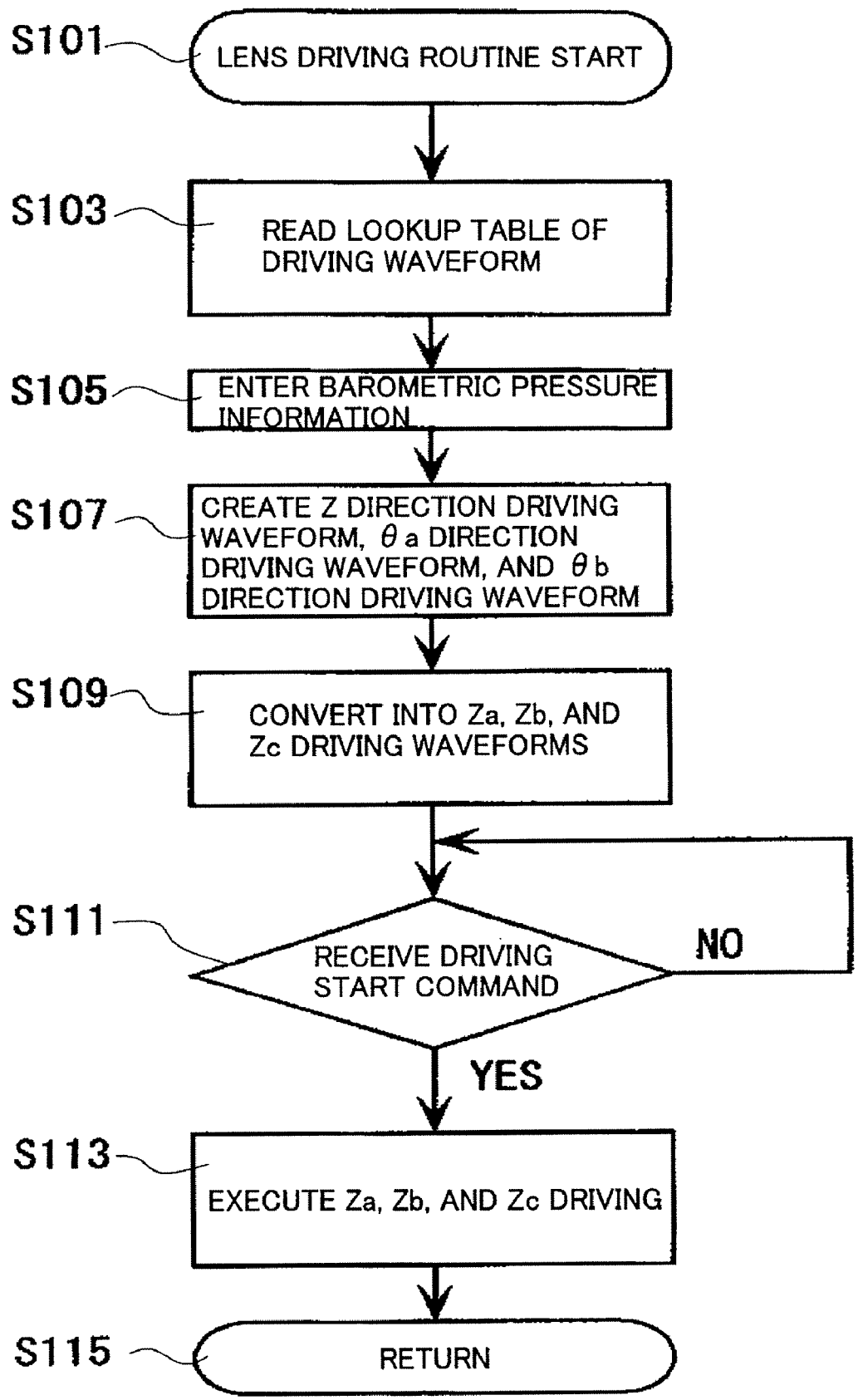
FIG. 8 is a control flow diagram of the optical-element driving unit according to the present invention.

FIG. 8 is a control flow by each lens CPU 11. The step S101 starts a lens driving routine through a communication with the body CPU 21.

In the step S103, the body CPU 21 reads a lookup table relating to a drive waveform of a lens to be driven. The table contains a wide variety of correction parameters, such as a correction amount of a lens driving position suitable for an illumination mode, a driving waveform used to correct, on a real-time basis, various aberrations of a reticle image which are generated with the reticle scan driving, and a correction amount used to correct an optical characteristic change of a lens when the illumination light is absorbed in the lens and heated.

The step S105 detects a barometric pressure of an ambient gas around the lens using an output of a barometric pressure sensor (not shown), and calculates a lens position correction amount due to the refractive index variance. The step S107 creates a translational driving waveform in the Z-axis direction and tilt driving waveforms in the θa and θb directions of the lens 103 shown in FIG. 3 from the information obtained in the steps S103 and S105.

The step S109 converts three types of lens driving waveforms created in the step S107 into Z direction driving waveforms Za, Zb, and Zc of the three driving mechanisms 110 shown in FIG. 3.

The step S111 communicates with the body CPU 21, and waits for the lens driving start command. Until the start command is received, the procedure waits in the step S111, and when the command is received, the procedure moves to the step S113.

The step S113 monitors an output of the sensors 102 and controls driving of the piezoelectric driver 12 so as to provide driving control with a driving waveform produced by the three sets of driving mechanism 110 in the step S109. One lens driving action ends at the step S115, and the procedure returns.

The above flow is used for driving control over the lens 103 shown in FIG. 3 with a desired waveform, but another lens may be used for similar control so as to optimize the imaging performance of the entire projection optical system 1 shown in FIG. 2 and accurately project an image of the reticle 5 onto the wafer 8.

This embodiment uses a stacked piezoelectric actuator for a driver, but may use another linear actuator that combines a motor with a ball screw.

Thus, the first embodiment provides the following effects:

A linear actuator, such as a stacked piezoelectric actuator, is apart from a final output part of the link mechanism that changes a direction of a displacement, or located at a position that is easy to access from the outside of the lens barrel.

Thereby, in the optical-element driving mechanism that arranges plural driving mechanisms around the optical element, the linear actuator is located almost outermost the lens barrel. This configuration facilitates the maintenance, such as a replacement, and provides a thin driving mechanism.

In addition, the approximately symmetrical link mechanism can minimize a displacement of the final output displacement part in an unintentional direction.

Since the displacement pickup link that contacts the actuator provides only a translational motion and no rotational displacements, the actuator generates no deformation stresses in a bending direction and can avoid damages.

A link adjacent to both sides of the final output displacement part of the driving mechanism restricts the degree of freedom in the X-axis direction, minimizes an unnecessary displacement of the final output displacement part in the X-axis direction, and maintains high rigidity in that direction.

The high degree of setting freedom of three elastic-hinge positions on the displacement pickup link enables the displacement magnification ratio of the piezoelectric actuator to be easily set to a desired value. In addition, the output displacement pickup member of the actuator is manufactured as a separate member from the direction conversion member for the picked-up displacement as another member. Therefore, the thickest part of the link mechanism can be made approximately as thin as the height of the actuator. This configuration also provides a thin driving mechanism that reduces a distance along the final output displacement.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Second Embodiment

In the first embodiment, the piezoelectric actuator 112 is driven in the tangential direction of the lens barrel 101. On the other hand, in the following second embodiment, the piezoelectric actuator is arranged in the radial direction (Y-axis direction) of the lens 103.

Figure 12A:
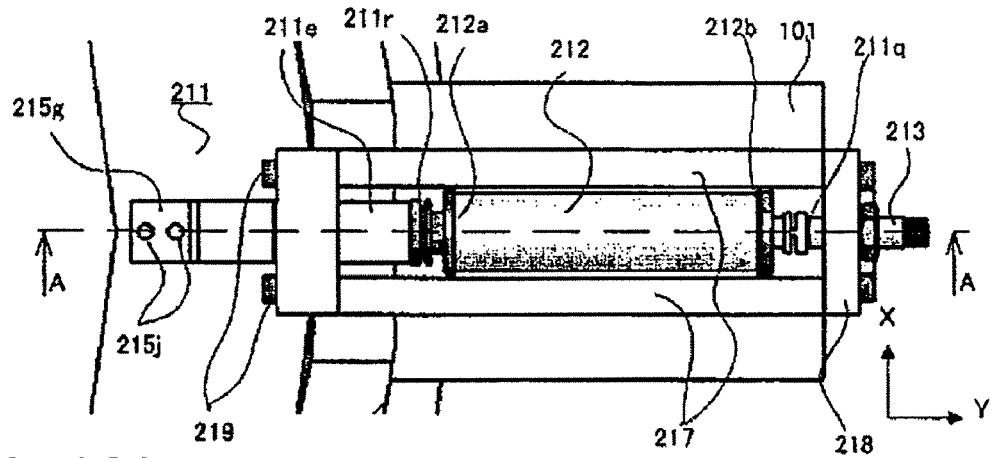
FIGS. 12A-C show a structure of the driving mechanism according to a second embodiment of the present invention.
Figure 12B:
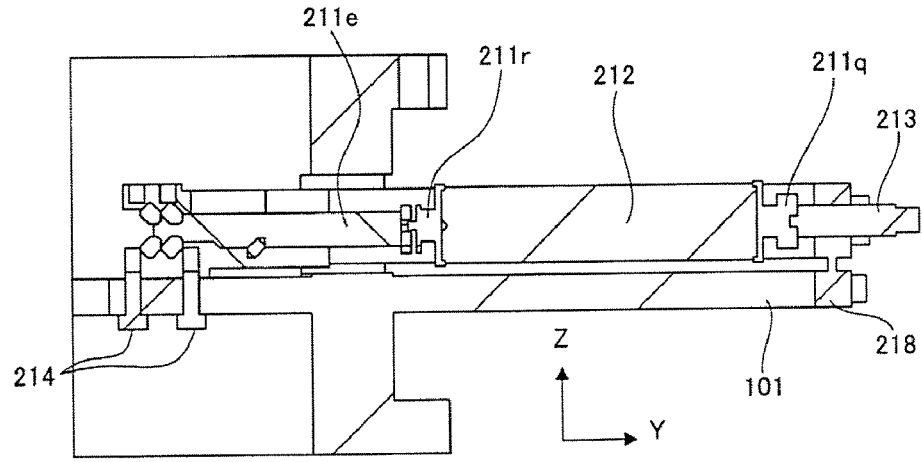
Figure 12C:
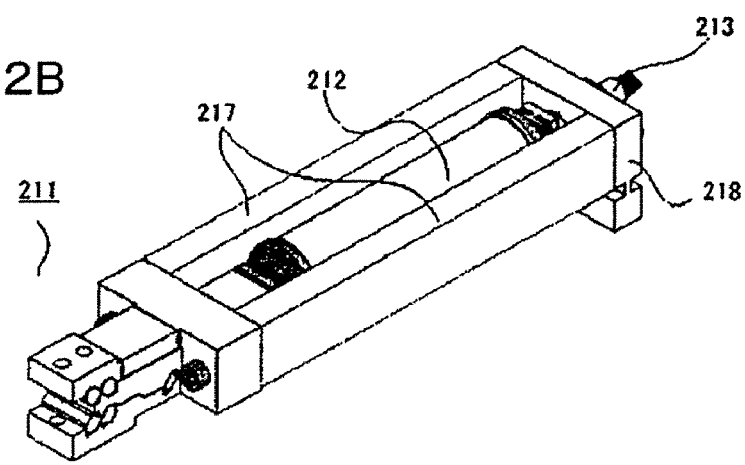

FIG. 12A is a plane view of the driving mechanism body according to the second embodiment of the present invention. FIG. 12B is a sectional view. FIG. 12C is a perspective view. In FIG. 12A, 101 denotes a flat part of the lens barrel. 211 denotes a driving mechanism body, and forms a link mechanism made from a metal block by wire electric discharge and milling. 212 denotes a stacked piezoelectric actuator, and sealed in a closed cylindrical vessel having a stretchable driving source in which in which electrostrictive strain elements and electrodes are alternately stacked, similar to the piezoelectric actuator 112 of the first embodiment. The overall length of the actuator 112 in the Y-axis direction increases approximately in proportion to the applied voltage. 213 is an adjustment screw that corrects a size error of the actuator 212, and preloads the actuator 212. The adjustment screw 213 is inserted between the holder end 218 and the actuator 212. A nut fixes the adjustment screw.

The driving mechanism body 211 is fastened onto the lens barrel 101 at a bottom of a lens-frame attachment screw 215 by driving-mechanism attachment screws from a back surface of the lens barrel 101. Due to this fastening, the piezoelectric actuator holder 217 serves as a cantilever. Since this configuration may provide an unnecessary low-order oscillation mode (for example, when a comparatively long piezoelectric actuator is used for a large stroke of the driving mechanism), an additional fixture is preferable with the holder end 218 and a spring.

Referring to FIG. 12B, a description will be given of a manufacturing method of the driving mechanism body 211.

The driving mechanism 211 is formed from a plate metal block as a base material having a predetermined thickness, and the outer shape of the link mechanism shown in FIG. 12B is formed through wire electric discharge and milling. Next, a connecting link 211e coupled with a piezoelectric receiver link 211r is detached from the driving mechanism body 211 by electric discharge. Finally, a borer is used to make a circular tapped-hole, and a bottom hole of an attachment tapped-hole, and an escape tapped-hole, and the process is completed.

A description will now be given of an assembly method of the driving mechanism. Initially, two piezoelectric actuator holders 217 and holder ends 218 are fastened by holder coupling screws 219. Next, the piezoelectric actuator 212 is mounted into the central space of the piezoelectric actuator, which is held by two piezoelectric receiver links 211r and 211q. Next, a pair of adjustment screws 213 are squeezed from the outside of the holder end 218 to press the bottom 212b of the piezoelectric actuator 212 in the left direction and to push the output end 212a of the piezoelectric actuator 212 against the right end of the connecting link 211e. The penetration amount by each adjustment screw 213 is approximately proportional to the preload amount of the piezoelectric actuator, and a rising amount of a lens-frame driving link 215g in the Z-axis direction may be adjusted to a desired amount with a height measurement instrument, such as a dial gauge. When three driving mechanisms are incorporated as shown in FIGS. 3A-C, characteristic scattering among them can be mitigated. A nut is preferably used for fastening so as to prevent loosening of the piezoelectric adjustment screw. This ends loading of the piezoelectric actuator 112.

Figure 13:
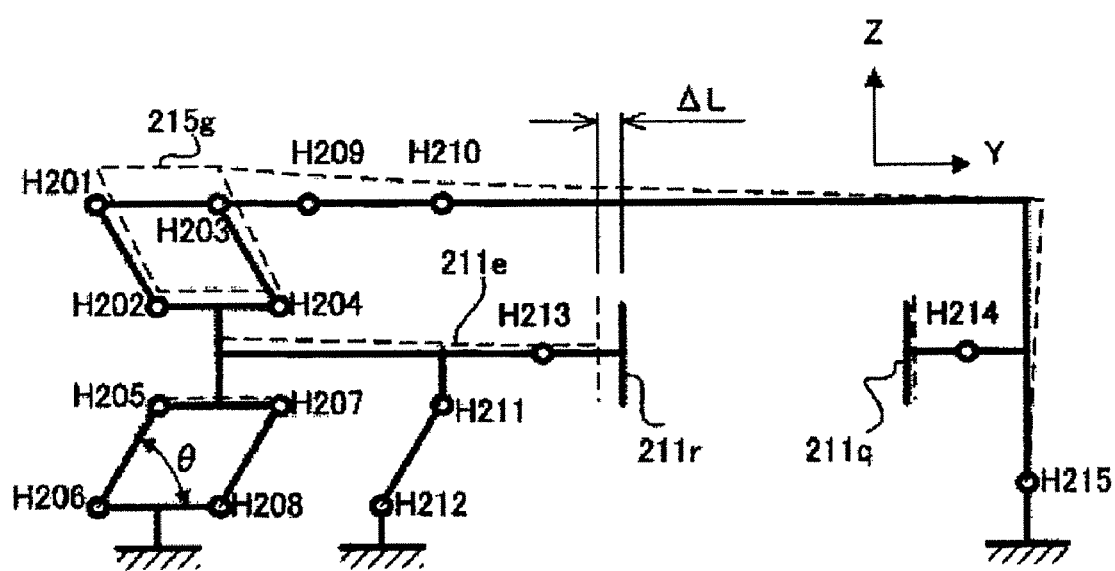
FIG. 13 is a view for explaining an operation of the driving mechanism according to the second embodiment of the present invention.

Referring now to FIG. 13, a description will be given of an operation of the link mechanism. When the predetermined voltage is applied to two electrode terminals (not shown) provided in the piezoelectric actuator 212, an overall length L of the piezoelectric actuator 112 is expanded by dL in the X-axis direction. When the driving mechanism body 211 is provided with a displacement of dL from the piezoelectric actuator 212, the radial displacement is converted into a displacement in the Z-axis direction by elastic hinges H201 to H208. A magnification (reduction) ratio at the direction conversion time is determined by an angle formed by four links (H201-H202, H203-H204, H205-H206, and H207-H208).

FIG. 13 expresses an angle θ of the link part of H205-H206 relative to the horizontal direction. The direction conversion magnification is defined as 2×cot θ when the three other link parts have the same angle θ. When the output link 215g displaces in the Y-axis direction, the optical performance deteriorates because the lens frame 104 coupled with it and the lens 103 displace on the XY plane and the lens deforms. In order to mitigate this problem, angles of the four direction conversion links can be slightly changed and adjusted.

According to the directional conversion method of this embodiment, the piezoelectric actuator 212 preferably moves in the Z-axis direction while ideally maintaining a horizontal orientation. However, this configuration separates the holder end 218 side from the lens barrel 101, and requires the driving mechanism body 211 side to serve as a cantilever, lowering the natural frequency, and making accurate positioning difficult. Therefore, as discussed above, this configuration uses the holder end 218 to fasten the lens barrel 101. The piezoelectric actuator 212 can move up and down around the elastic hinge H215 as a fulcrum on the holder end 218.

The displacement dL generated by the piezoelectric actuator 212 occurs not only in the driving mechanism body 211 but also in the holder end 218. In order to efficiently transmit a slight displacement of the piezoelectric actuator 212 to driving of the lens frame 104, it is particularly important to maintain high the rigidity of the piezoelectric actuator 217.

The elastic hinges H209 and H210 are guides that move the lens-frame driving link 215g in a direction as horizontal as possible.

H211-212 are guides that move the connecting link 211e approximately horizontally.

The piezoelectric actuator 212 is likely to get damaged upon a bending moment. The mechanism of this embodiment utilizes H213 and H214 to ease the influence of the bending moment. In order to handle a moment around each of the X axis and the Z axis, two elastic hinges are arranged at a right angle when viewed from the Y-axis direction.

An operation similar to the first embodiment is available by replacing the driving mechanism 110 shown in FIGS. 3A-C with the driving mechanism 211 of the second embodiment, and by using the control block and the control flow described with reference to FIGS. 7 and 8.

Even in the second embodiment, in sealing the barrel, the fluid sealing arrangement 120 (not shown) may be arranged between the lens barrel 101 and the driving mechanism 211 or a cover may be attached to cover the entire perforations from the lens barrel 101.

Thus, the second embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism.

In addition, the approximately symmetrical link mechanism can minimize a displacement of the final output displacement part in an unintentional direction.

Since the displacement pickup link that contacts the actuator provides only a translational motion and no rotational displacements, the actuator generates no deformation stresses in a bending direction and can avoid damages.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Third Embodiment

The second embodiment arranges the piezoelectric actuator in the radial direction, and allows the driving mechanism body to convert an input displacement on the horizontal surface into a displacement in the optical-axis direction. In this mechanism, the rigidity in the tangential direction (or the X-axis direction in FIG. 11) is comparatively low. When three driving mechanism bodies are incorporated into an optical-element driving mechanism, it does not have a sufficiently high natural frequency on the horizontal plane, causes a vibration of the optical element due to the disturbance vibration, and may lower the optical performance. This embodiment is an illustration that arranges a supplemental link with the foregoing problem in mind.

Figure 14A:
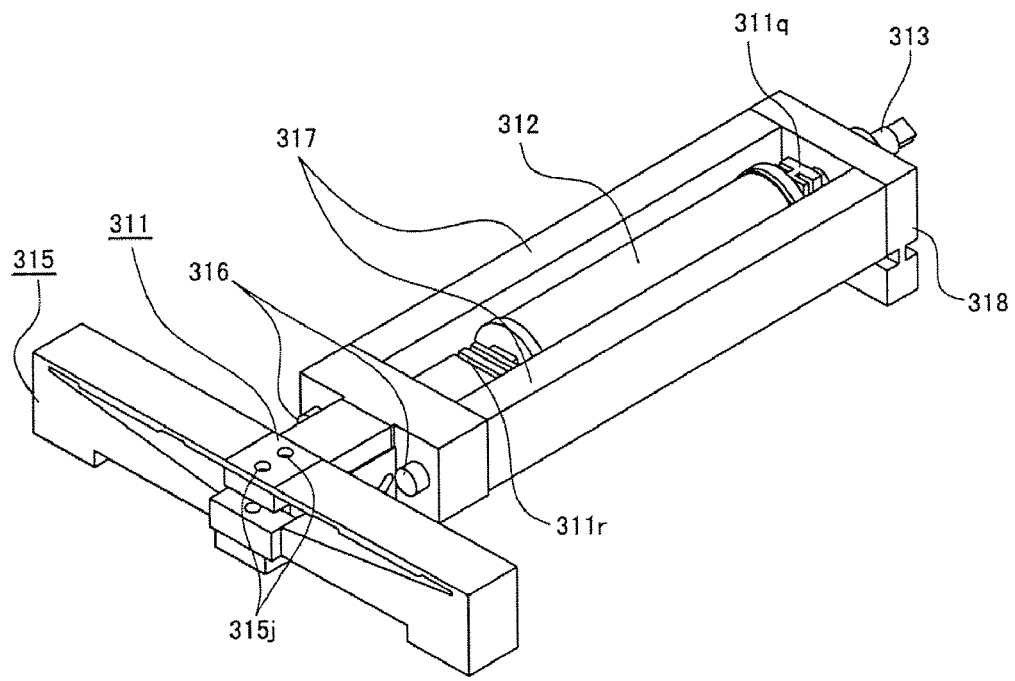
FIGS. 14A-B are views for explaining a structure and an operation of a driving mechanism according to a third embodiment of the present invention.

FIG. 14A is a perspective view according to the third embodiment of the present invention, and adds to the mechanism shown in the second embodiment a supplemental link mechanism 315 that reinforces the rigidity of the tangential direction (X-axis direction). The lens barrel is omitted. A driving mechanism body 311 is the same as that of the second embodiment, and thus only the supplemental link 315 will be discussed.

Figure 14B:
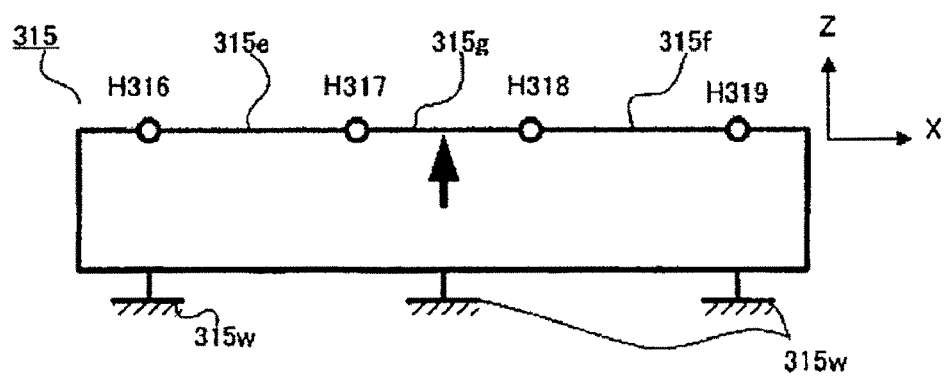

FIG. 14B shows an operation of the supplemental link mechanism 315. In order to restrict a movement of the lens-frame driving link 315g in the X-axis direction, the support links 315e and 315f are connected to both left and right sides of the lens-frame driving link 315g. The links restrict the degree of freedom in the X-axis direction, although having the degree of freedom of displacement in the Z-axis direction. On the other hand, the degree of freedom in the Y-axis direction is also restricted because the rigidity of the supplemental link in the Y-axis direction increases. The above structure allows an area of tapped hole 315j in the lens frame attachment link 315g to displace only in the Z-axis direction, and restricts the degree of freedom in the X and Y directions, providing accurate driving of the lens frame 104 in the Z-axis direction.

An operation similar to the first embodiment is available by replacing the driving mechanism 110 shown in FIGS. 3A-C with the driving mechanism 311 of the third embodiment, and by using the control block and the control flow described with reference to FIGS. 7 and 8.

Even in the third embodiment, in sealing the barrel, the fluid sealing arrangement 120 (not shown) may be arranged between the lens barrel 101 and the driving mechanism 311 or a cover may be attached to cover the entire perforations from the lens barrel 101.

Thus, the third embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replace, and provides a thin driving mechanism.

In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Fourth Embodiment

FIG. 15A is a plane view of the driving mechanism body according to the fourth embodiment of the present invention. FIG. 15B is a side view. FIG. 15C is a sectional view. The lens barrel 101 is not illustrated. 411 denotes a driving mechanism body, and forms a link mechanism made from a metal block by wire electric discharge and milling. 412 denotes a stacked piezoelectric actuator, and sealed in a closed cylindrical vessel that has a stretchable driving source that alternately layers the electrostrictive strain elements and electrodes, similar to the piezoelectric actuator 112 of the first embodiment and its overall length in the Y-axis direction increases approximately in proportion to the applied voltage. 413 is an adjustment screw that corrects a size error of the actuator 412, and pre-loads the actuator 412. The adjustment screw 413 is inserted between a holder end 418 and a piezoelectric receiver link 411q. A nut fixes the adjustment screw. The holder end 418 is connected to the driving mechanism body 411 via a piezoelectric holder 417. The other end of the holder end 418 is fixed onto the lens barrel 101, and its part is provided with an elastic hinge. A proper selection of a shape parameter enables the area of the lens frame attachment tapped-hole 415j of the driving mechanism would cancel a slight displacement amount in the Y-axis direction.

Figure 16A:
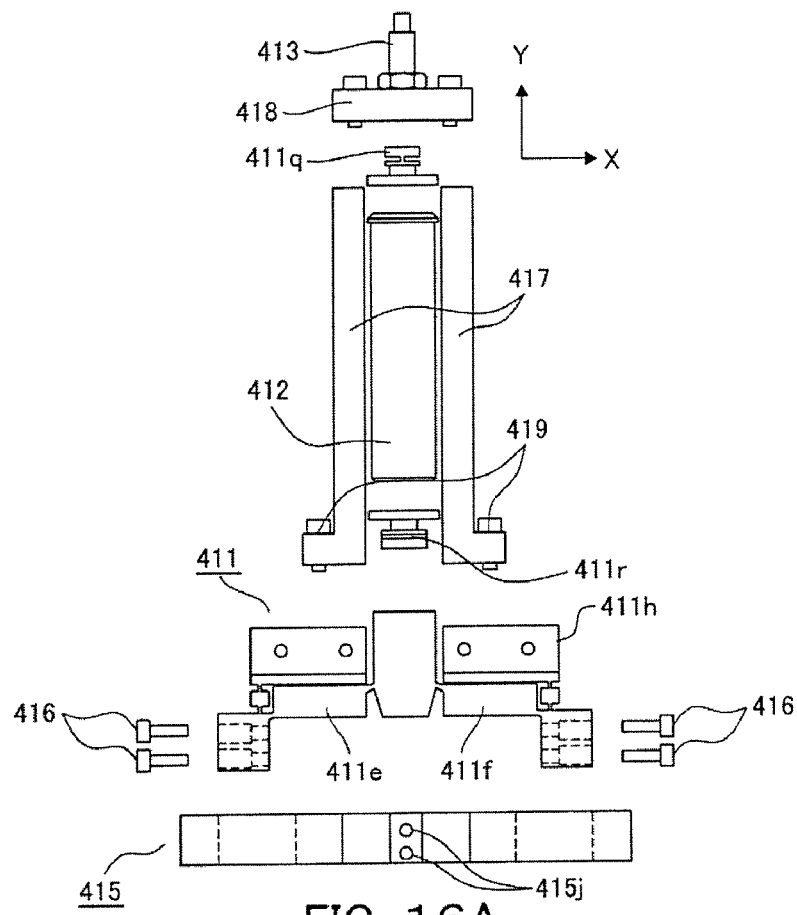
FIGS. 16A-C show a detailed structure of the driving mechanism according to the fourth embodiment of the present invention.
Figure 16B:
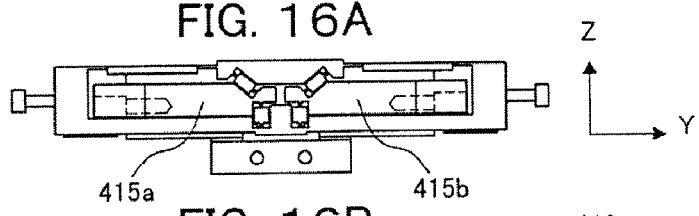
Figure 16C:
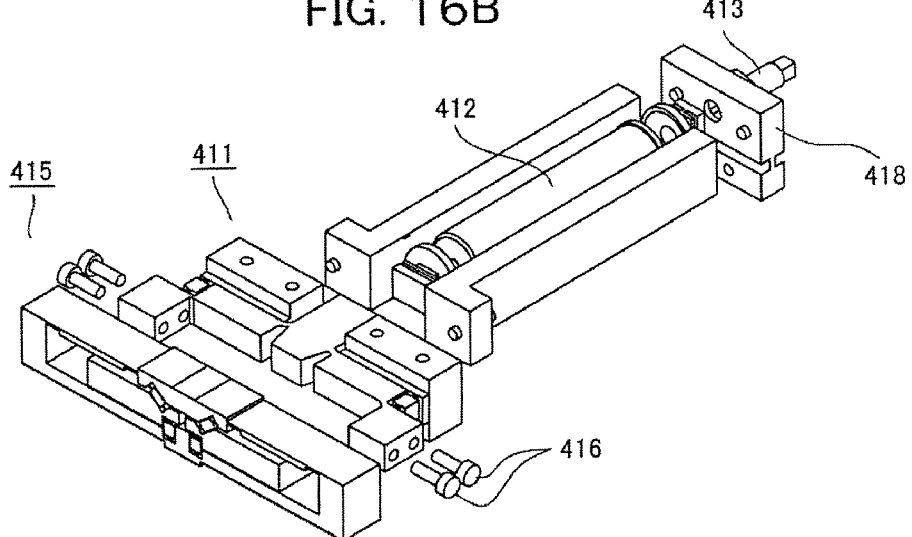

FIGS. 16A-C are exploded views of the mechanism of this embodiment. FIG. 16A is an exploded plane view. FIG. 16B is an exploded side view. FIG. 16C is an exploded perspective view.

Referring now to FIG. 16A, a description will be given of a manufacturing method of the driving mechanism body 411 and the direction conversion member 415. Initially, the driving mechanism body 411 is formed from a plate metal block as a base material having a predetermined thickness, and the outer shape of the link mechanism shown in FIG. 16A is formed through wire electric discharge and milling. Next, a borer is used to form a circular tapped-hole of the fixture link 411h, and then a bottom hole of an attachment tapped-hole and an escape tapped-hole from the arm side surfaces at both sides. Thus, the process is completed.

The direction conversion member 415 is formed from a plate metal block as a base material having a predetermined thickness, and the outer shape of the link mechanism shown in FIG. 16B is formed through wire electric discharge and milling. Next, a borer is used to form a bottom hole of a lens-frame attaching tapped-hole 415j shown at the center of FIG. 16A, and then a bottom hole of an attachment tapped-hole and an escape hole from both side surfaces. Finally, the lens-frame attaching tapped-hole 415j and bottom holes of the horizontal links 115a and 115b are made, and the process is completed.

In the perspective view of FIG. 16C, both side arms of the driving mechanism body 411 are inserted into a pair of windows in the direction conversion member 415, and both are coupled with the conversion member coupling screws 416. Next, a piezoelectric holder 417 is fastened onto the driving mechanism body 411. The piezoelectric actuator 412 fixes piezoelectric receiver links 411q and 411r at both output ends thereof. One end is fixed onto the driving mechanism body 411, and the other end is fixed onto the holder end 418 having the adjustment screw 413. The holder end 418 is screwed onto the piezoelectric holder 417. Finally, a feed amount of the adjustment screw 413 is adjusted and fixed with a nut by measuring a rise amount of the lens-frame driving link 415g in the Z-axis direction with a height measurement instrument, such as a dial gauge.

Figure 17A:
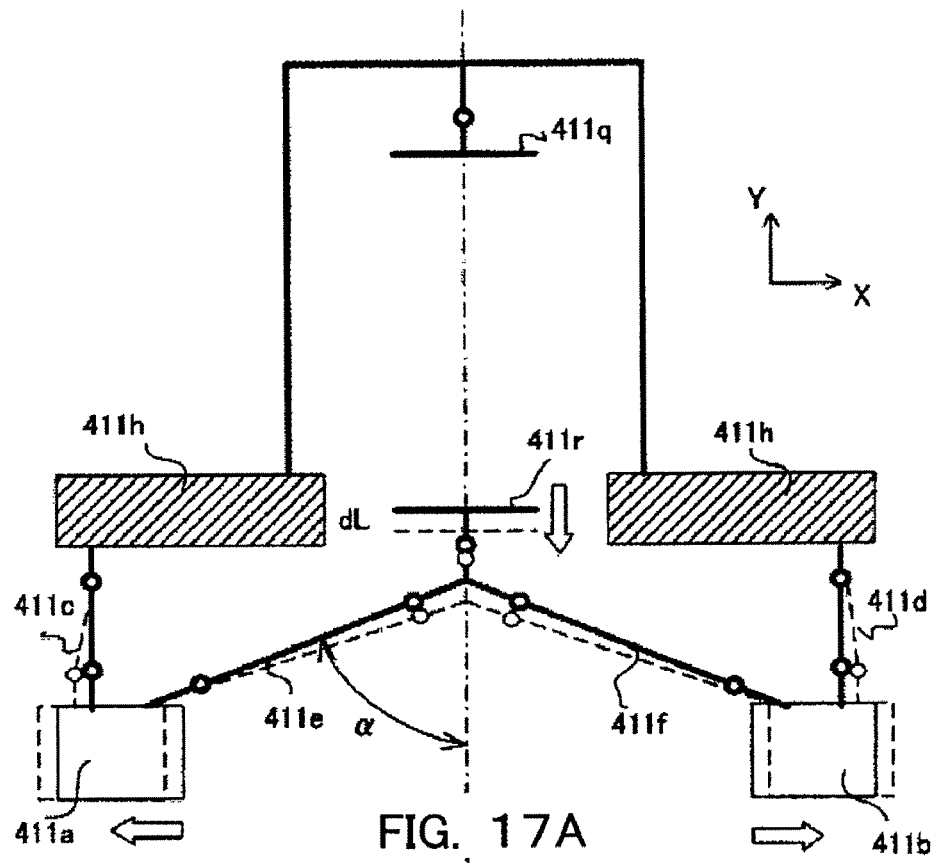
FIGS. 17A-B are views for explaining an operation of the driving mechanism according to the fourth embodiment of the present invention.
Figure 17B:
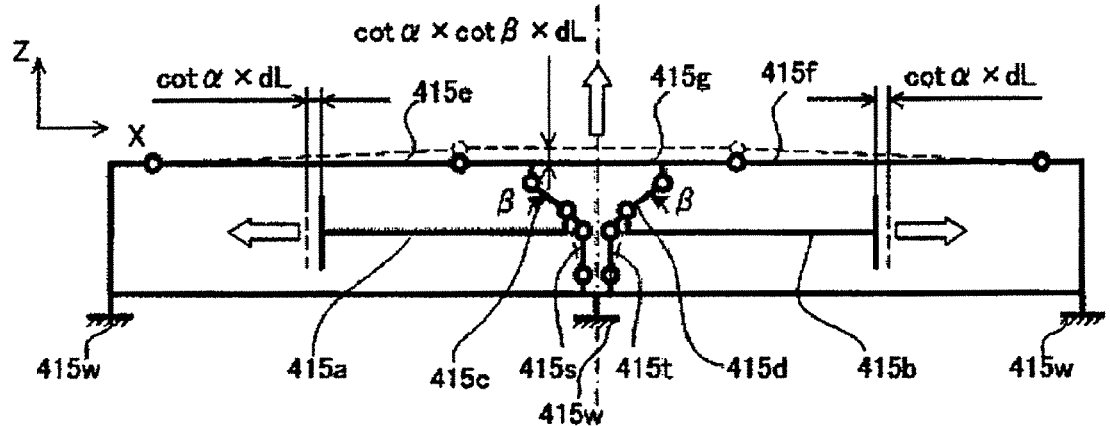

Referring now to FIG. 17, a description will be given of an operation of the link mechanism. When the driving mechanism body 411 is provided with a displacement dL from the piezoelectric actuator 412, a displacement in the radial direction (or the Y-axis direction) is converted into the tangential direction (or the X-axis direction) by the connecting links 411e and 411f. The fixture link 411h to supplemental links 411c and 411d are arranged so that the horizontal links 411a and 411b can move in parallel in the X-axis direction.

Displacements of the horizontal links 411a and 411b of the driving mechanism body 411 are transmitted to the horizontal links 415a and 415b of the direction conversion member 415. The displacement in the X-axis direction is converted into the displacement in the Z-axis direction by the rotations of the direction conversion links 415c and 415d. The generated displacement dL of the piezoelectric actuator 412 is transmitted to the lens-frame driving link 415g by two-stage direction conversions, and the total conversion ratio can be expressed as almost $\cot \alpha \times \cot \beta$. Therefore, a proper parameter may be selected by a required stroke.

Thus, the lens-frame driving link 415g displaces in the Z direction as the piezoelectric actuator 412 expands and shrinks, and it is preferable that the link displaces only in the Z-axis direction and does not displace in the X or Y direction. For this characteristic, the following supplemental link is provided. The support links 415e and 415f are connected to both left and right sides of the lens-frame driving link 415g so as to restrict a movement of the lens-frame driving link 415g in the X-axis direction. These support links provide the lens-frame driving link 415g with a degree of freedom of displacement in the Z-axis direction, restricting the degree of freedom in the X-axis direction. In addition, other support links 415s and 415t restrict a movement of the lens-frame driving link 415g in the Y-axis direction. These support links are located near the centers of the horizontal links 415a and 415b, maintain the degree of freedom of the horizontal link in the X-axis direction, and restrict the degree of freedom in the Y-axis direction. Accordingly, the restriction effect of the horizontal links 415a and 415b in the Y-axis direction is transmitted to the lens-frame driving link 415g via the direction conversion links 415c and 415d. This structure allows an area of the tapped hole 415j of the lens-frame attaching link 415g to displace only in the Z-axis direction, and its degree of freedom of movement in each of the X and Y directions is restricted. Therefore, the lens frame 104 can be precisely driven in the Z-axis direction.

An operation similar to the first embodiment is available by replacing the driving mechanism 110 shown in FIGS. 3A-C with the driving mechanism 411 of the fourth embodiment, and by using the control block and the control flow described with reference to FIGS. 7 and 8.

Even in the fourth embodiment, in sealing the barrel, the fluid sealing arrangement 120 (not shown) may be arranged between the lens barrel 101 and the driving mechanism 411 or a cover may be attached to cover the entire perforation from the lens barrel 101.

Thus, the fourth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism.

In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Fifth Embodiment

Figure 19A:
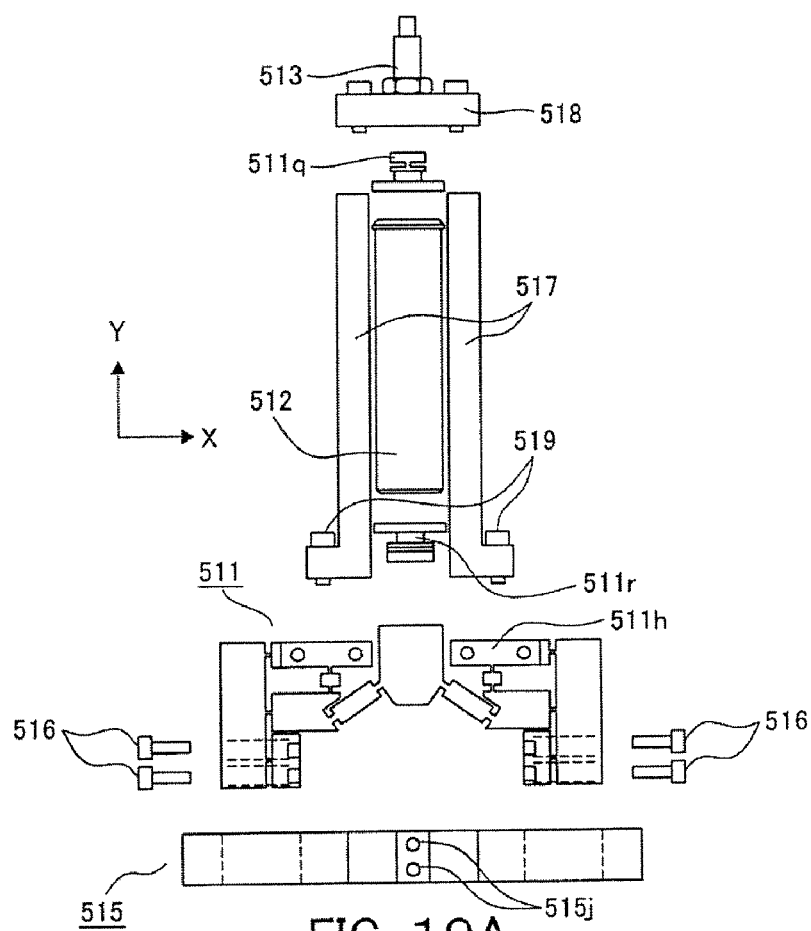
FIGS. 19A-C show a detailed structure of the driving mechanism according to the fifth embodiment of the present invention.
Figure 19B:
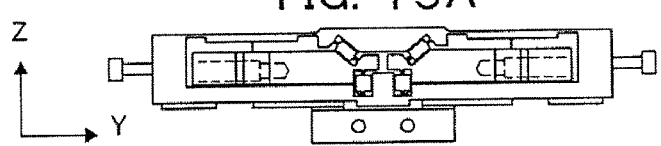
Figure 19C:
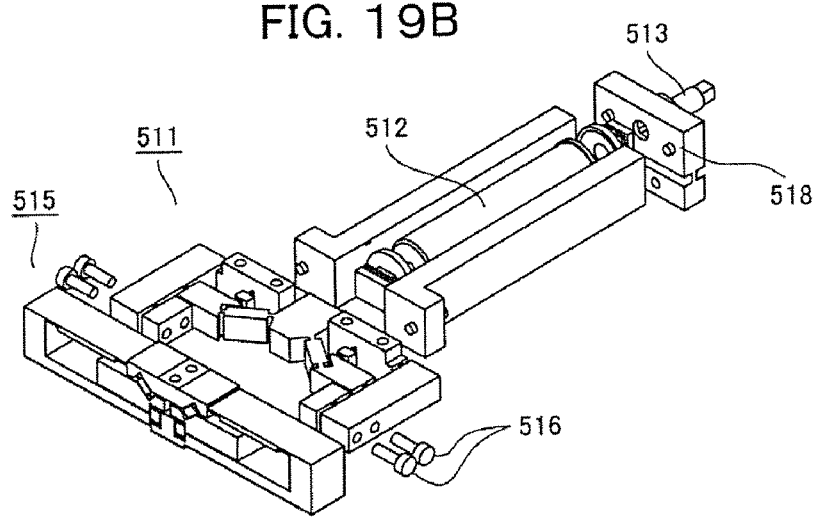

FIG. 18A is a plane view of a driving mechanism body according to the fifth embodiment of the present invention. FIG. 18B is a side view. FIG. 18C is a sectional view. FIGS. 19A-C are exploded views. The lens barrel 101 is not illuminated.

The fifth embodiment differs from the fourth embodiment only in a driving mechanism body 511. Therefore, the following description will address this difference.

Figure 20A:
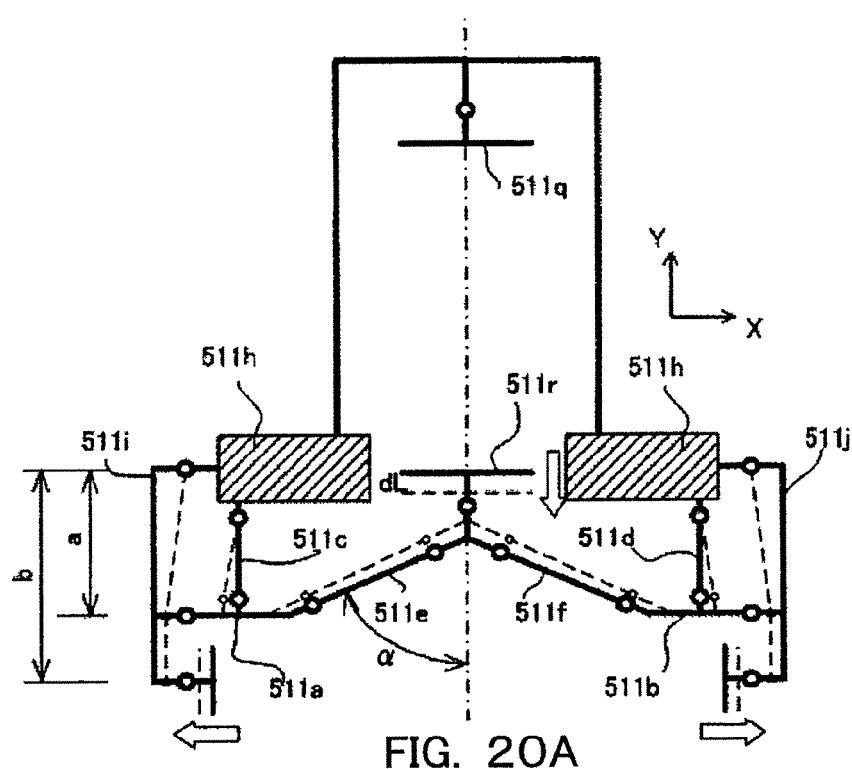
FIGS. 20A-B are views for explaining an operation of the driving mechanism according to the fifth embodiment of the present invention.
Figure 20B:
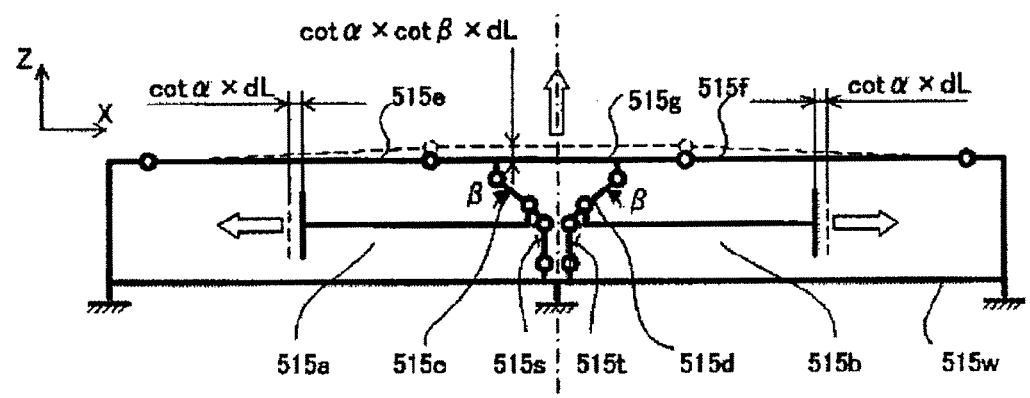

Referring now to FIGS. 20A-B, a description will be given of an operation of the link mechanism.

Similar to the driving mechanism body 411 described in the fourth embodiment, the driving mechanism body 511 of this embodiment converts a displacement by a piezoelectric actuator 512 into a displacement in X-axis direction using connecting links 511e and 511f. A fixture link 511h to supplemental links 511c and 511d are arranged in such a preferable manner that horizontal links 511a and 511b move in parallel in the X-axis direction. The X-axis displacements of the horizontal links 511a and 511b are magnified by b/a times by illustrated shape parameters of the displacement magnification links 511i and 511j, and transmitted to the direction conversion member. The displacement in the X-axis direction given to the direction conversion member is converted into the displacement in the Z-axis direction by the direction conversion links 515c and 515d, and finally becomes a displacement of the lens-frame driving link 515g. A conversion magnification can be expressed as cot α×(b/a)×cot β times. A proper parameter is selected according to the required stroke.

Thus, the lens-frame driving link 515g displaces in the Z direction as the piezoelectric actuator 512 expands and shrinks, and it is preferable that the link displaces only in the Z-axis direction and does not displace in the X or Y direction. For this characteristic, the following supplemental link is provided. The support links 515e and 515f are connected to both left and right sides of the lens-frame driving link 515g so as to restrict a movement of the lens-frame driving link 515g in the X-axis direction. These support links provide the lens-frame driving link 515g with a degree of freedom of displacement in the Z-axis direction, restricting the degree of freedom in the X-axis direction. In addition, other support links 515s and 515t restrict a movement of the lens-frame driving link 515g in the Y-axis direction. These support links are located near the centers of the horizontal links 515a and 515b, maintain the degree of freedom of the horizontal link in the X-axis direction, and restrict the degree of freedom in the Y-axis direction. Accordingly, the restriction effect of the horizontal links 515a and 515b in the Y-axis direction is transmitted to the lens-frame driving link 515g via the direction conversion links 515c and 515d. This structure allows an area of the tapped hole 515j in the lens frame attachment link 515g to displace only in the Z-axis direction, and restricts its degree of freedom of movements in the X and Y directions. Therefore, the lens frame 104 can be precisely driven in the Z-axis direction.

An operation similar to the first embodiment is available by replacing the driving mechanism 110 shown in FIGS. 3A-C with the driving mechanism 511 of the fifth embodiment, and by using the control block and the control flow described with reference to FIGS. 7 and 8.

Even in the fifth embodiment, in sealing the barrel, the fluid sealing arrangement 120 (not shown) may be arranged between the lens barrel 101 and the driving mechanism 511 or a cover may be attached to cover the entire perforation from the lens barrel 101.

Thus, the fifth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as an exchange, and provides a thin driving mechanism.

In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Sixth Embodiment

The sixth to tenth embodiments are illustrations that apply an apparatus used to deform a surface shape of an optical element to the driving mechanism.

FIGS. 21A-C are illustration that applies the driving mechanism described in the first embodiment to an apparatus that deforms a surface of an optical element, in particular, a lens.

FIGS. 21A-C attach two driving mechanisms 110 to the lens barrel 101 around the optical axis at regular intervals of about 180°. The lens frame 104 that supports the lens 103 is fastened onto the lens barrel 101 by the optical-element inner-ring fixing screw 121 at positions that rotate by 90° around the optical axis to the driving mechanism 110. See FIG. 21c. When the output parts of the two driving mechanisms 110 displace by the same amount in a direction almost along the optical axis, the lens 103 deforms so that it bends around the Y axis, consequently providing an aberrational correction of 2θ component.

Plural (e.g., two in FIG. 21) sensors 102 measure a displacement of the driving mechanism 110 in the optical-axis direction, similar to the driving mechanism 110. It is preferable that the sensor 102 is arranged at a position of the driving mechanism 110, but an adjacent arrangement to the (upper and lower) barrel (optical element) would cause interference. Therefore, it may be arranged at a position that shifts by a certain angle around the optical axis from the driving mechanism 110 as shown in FIGS. 21A-C.

Similar to the means described in the first to fifth embodiments, the sensor used as the sensor 102 is properly selected, for example, from an interferometer type distance measuring unit using a semiconductor laser, an electrical capacitance sensor, a linear encoder, a differential transformer displacement sensor, and an eddy-current displacement sensor.

The controller provides such control based on the measurement result of the sensor 102 that the surface deformation amount of the lens 103 becomes a desired value.

Figure 22:
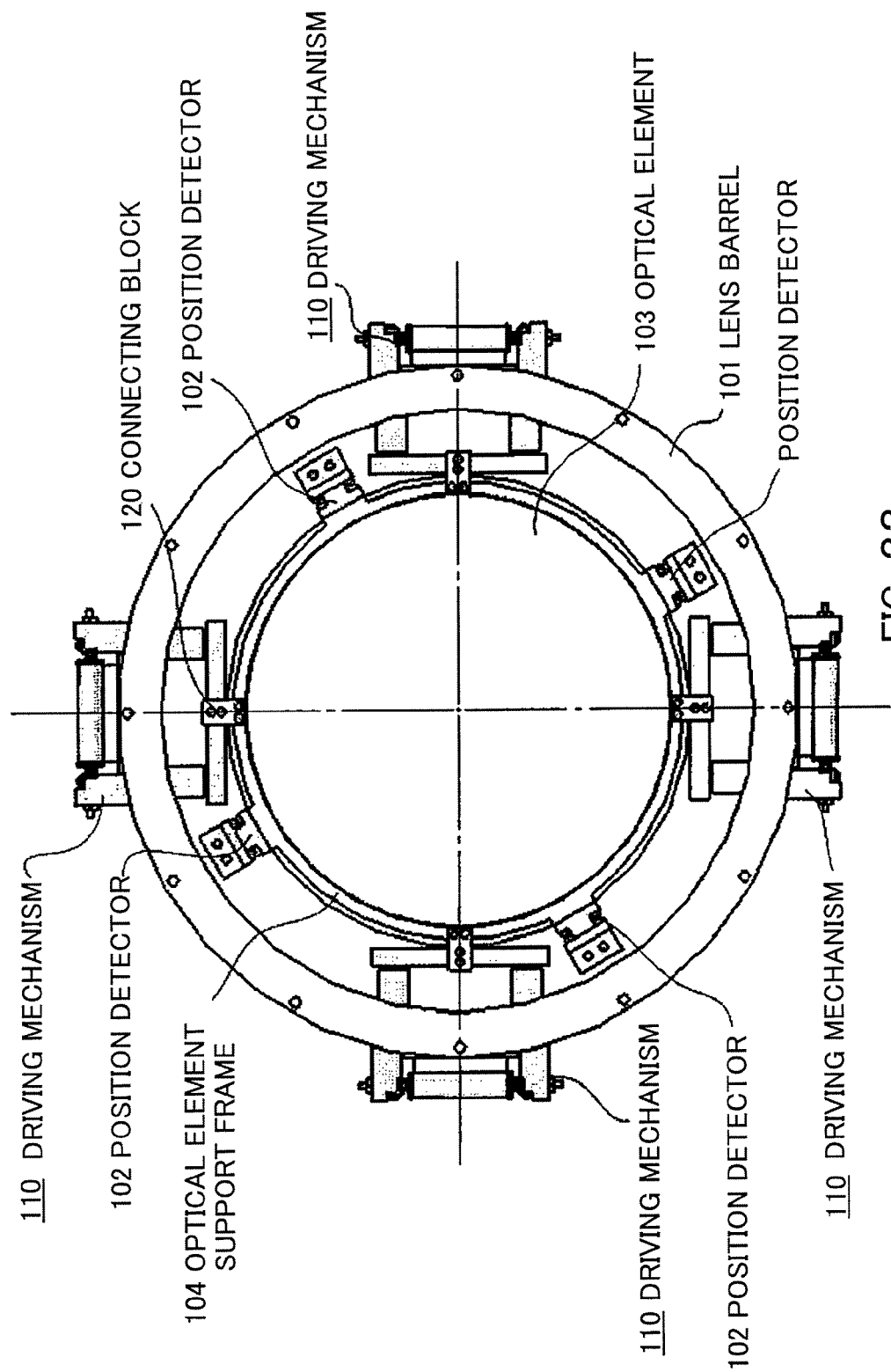
FIG. 22 shows another illustration that applies the driving mechanism according to a sixth embodiment of the present invention to an optical-element deforming mechanism.

In order to control the lens 103 with a high order deformation shape, more driving mechanisms 110 may be arranged around the lens frame 104. For example, the driving mechanisms 110 are arranged at regular intervals around the optical axis, providing a shape control of a 3θ component. FIG. 22 is an illumination that arranges four driving mechanisms 110 at regular intervals (at about 90° intervals) around the optical axis, and a pair of opposing driving mechanisms may be used to displace in the optical-axis direction by almost the same amount.

Thus, when the lens frame 104 is displaced in the Z direction as the piezoelectric actuator 112 stretches, the piezoelectric 103 is deformed into a desired shape for an improvement of the optical performance.

Thus, the sixth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism. In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

A link that restricts the degree of freedom in the X-axis direction is adjacent to both sides of the final output displacement part of the driving mechanism. Thus, an unnecessary displacement of the final output displacement part in the X-axis direction can be minimized and the rigidity in the direction can be made extremely high.

In addition, since the degree of freedom of setting of three elastic-hinge positions provided to the displacement pickup link is high, a displacement magnification ratio of the piezo-electric actuator can easily be set to a desired value. Moreover, the output displacement pickup member of the actuator and the direction conversion member of the picked direction are manufactured as separate members, and the thickest part of the link mechanism is made as thin as the height of the actuator. This configuration effectively provides a thin driving mechanism having a shortened size in the final output displacement direction.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Seventh Embodiment

Figure 23A:
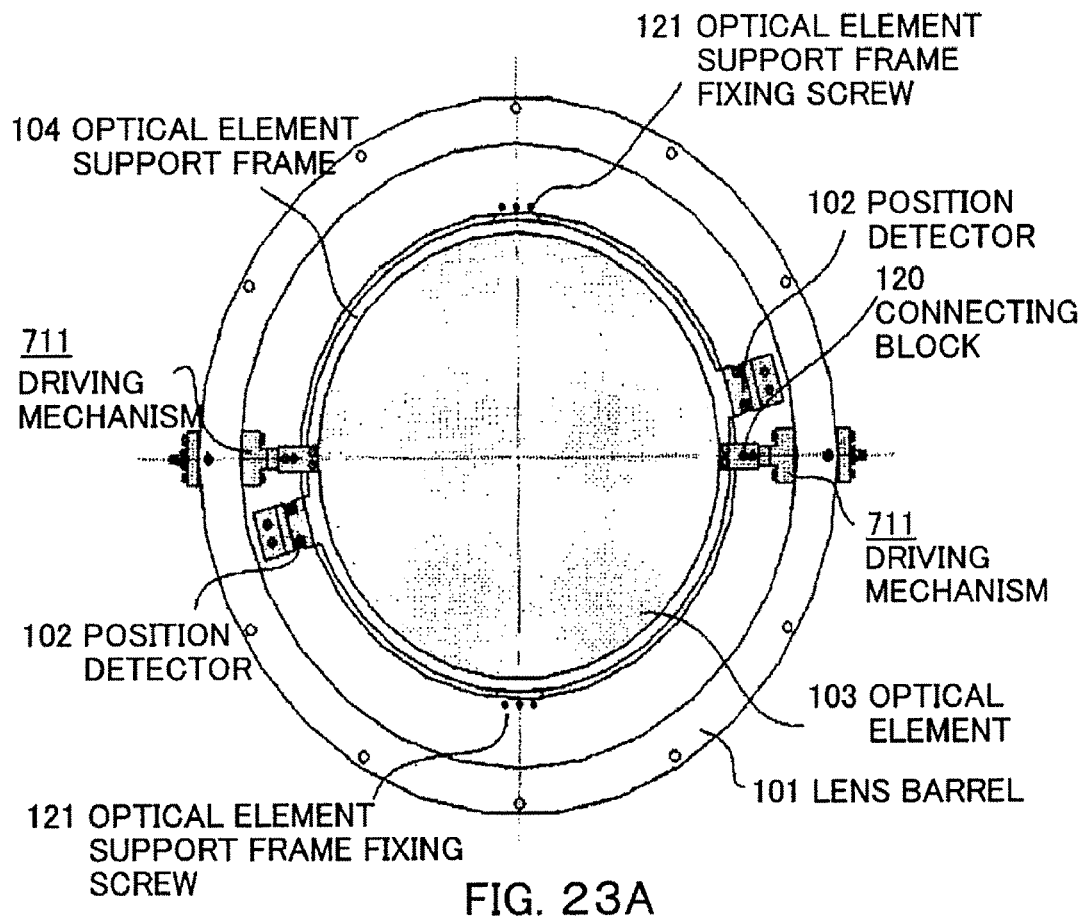
FIGS. 23A-B show an illustrative structure that applies the driving mechanism according to a seventh embodiment of the present invention to an optical-element deforming mechanism.
Figure 23B:
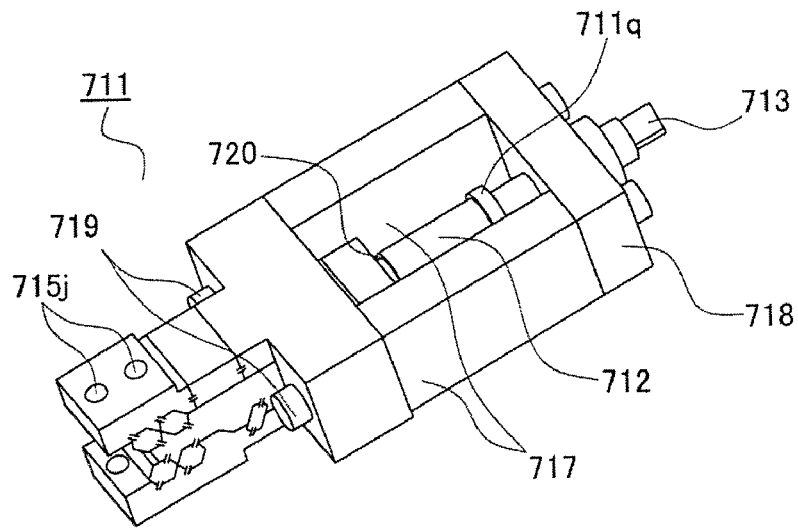

FIGS. 23A-B show an illumination that applies the driving mechanism 211 of the second embodiment to the apparatus that deforms the optical element, in particular, the lens surface.

Figure 28A:
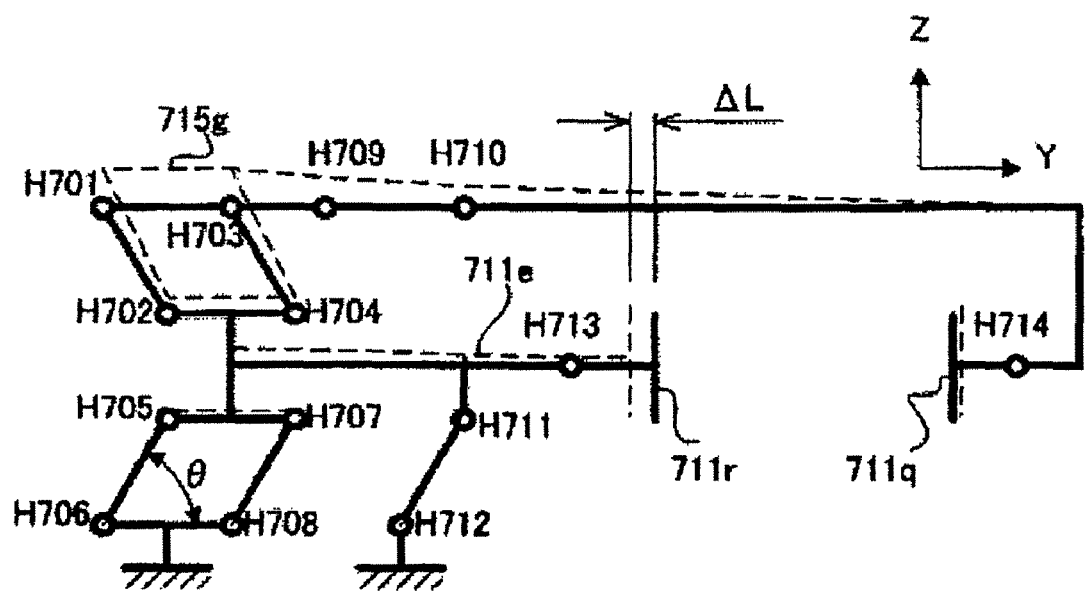
FIGS. 28A-B are views for explaining an operation of another illustration of the driving mechanism according to the seventh embodiment of the present invention.
Figure 28B:
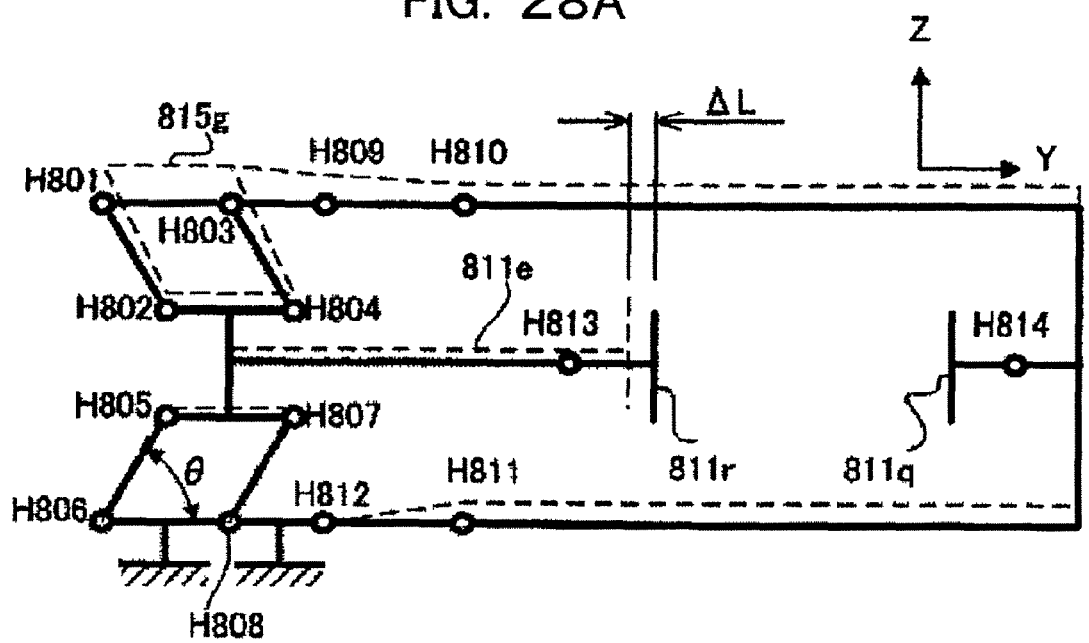

A driving mechanism 711 may use the mechanism 211 of the second embodiment. However, a displacement amount necessary to deform the lens becomes smaller than that of the second embodiment (which is a mechanism that changes an orientation of the optical element), and the piezoelectric actuator 712 as an input source can use a shorter type than the second embodiment. As a result, a holder end 718 requires no additional spring H215 and coupling with a lens barrel that are necessary in the mechanism of the second embodiment. When the mechanism has such a low rigidity that the optical element is resonated relative to the disturbance oscillation, the additional spring and coupling with the lens barrel are necessary. FIG. 28A shows an operational principle view of the driving mechanism 711.

FIG. 23B is a perspective view of the driving mechanism body 711 according to the seventh embodiment of the present invention. 711 denotes a driving mechanism body, forming a link mechanism made from a metal block by the wire electric discharge and milling. 712 denotes a stacked piezoelectric actuator, and sealed in a closed cylindrical vessel that has a stretchable driving source that alternately layers the electrostrictive strain elements and electrodes, similar to the piezoelectric actuator 112 of the first embodiment. An overall length of the actuator 712 in the Y-axis direction increases approximately in proportion to the applied voltage. 713 is an adjustment screw that corrects a size error of the actuator 712, and pressurizes the actuator 712. The adjustment screw 713 is inserted between the holder end 718 and the actuator 712. A nut fixes the adjustment screw. As shown in FIGS. 23A-B, an attachment to the lens barrel 101 only with part of the bottom surface of the driving mechanism 711 enables a driving force of the actuator to transmit to the lens barrel, mitigating an unnecessary deformation and an erroneous output of the sensor 102.

The second embodiment eases a detrimental moment to the piezoelectric actuator by coupling the piezoelectric actuator with the driving mechanism via the piezoelectric receiver links 211q and 211r having the elastic hinge. This embodiment couples the driving mechanism 711 with one end of the piezoelectric actuator 712 the steel ball 720. Like the second embodiment, coupling with the piezoelectric receiver links 211q and 211r may be used.

FIG. 23A shows an illumination that applies the driving mechanism 711 to the optical-element surface deformation apparatus for a 2θ component correction. Two driving mechanisms 110 are arranged to the lens barrel 101 around the optical axis at regular intervals of about 180°, and the output part is fastened onto the lens frame 104 that supports the lens 103. The lens frame 104 is fastened onto the lens barrel 101 by the optical-element inner-ring fixing screw 121 at positions that rotates by 90° around the optical axis to the driving mechanism 710, or at two locations. When the output parts of the two driving mechanisms 711 displace by the same amount in a direction almost along the optical axis, the lens 103 deforms or bends around the Y axis.

In order to correct a higher order, such as a 3θ component and a 4θ component, as described in the sixth embodiment, the mounting number of driving mechanisms 711 increases with the degree of freedom. An explanation with the drawing will be omitted.

FIG. 28A is a schematic view of a variation of the driving mechanism, which replaces H711 and H712 of the driving mechanism 711 with H811 and H812.

Figure 24A:
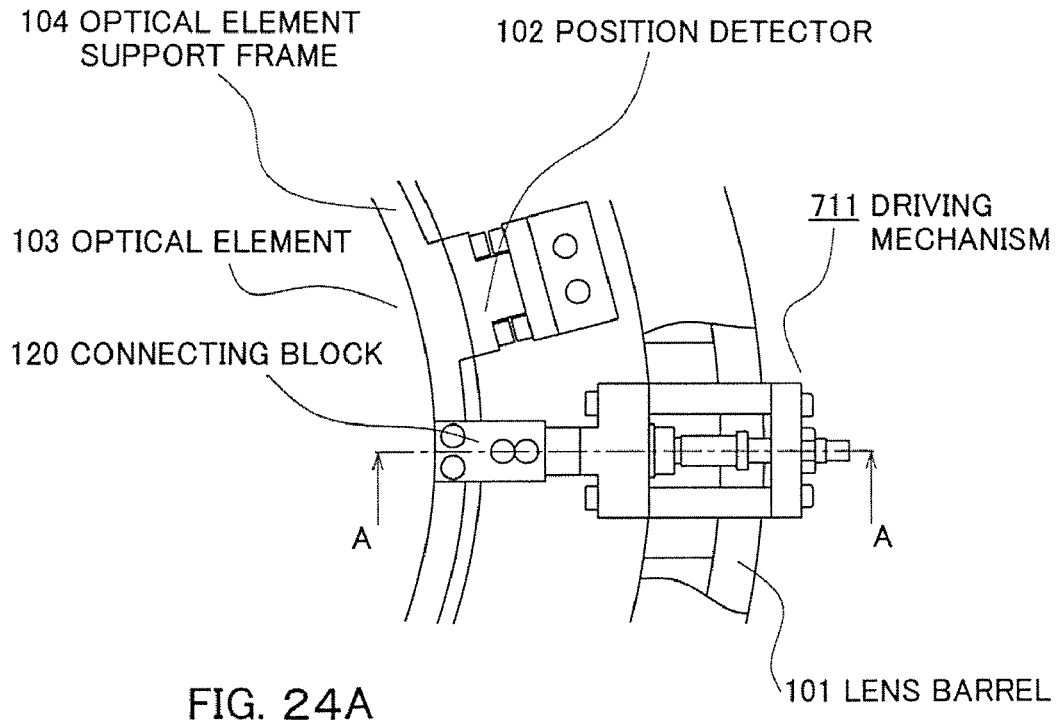
FIGS. 24A-B are partially enlarged views of the driving mechanism according to the seventh embodiment of the present invention applied to an optical-element deforming mechanism.
Figure 24B:
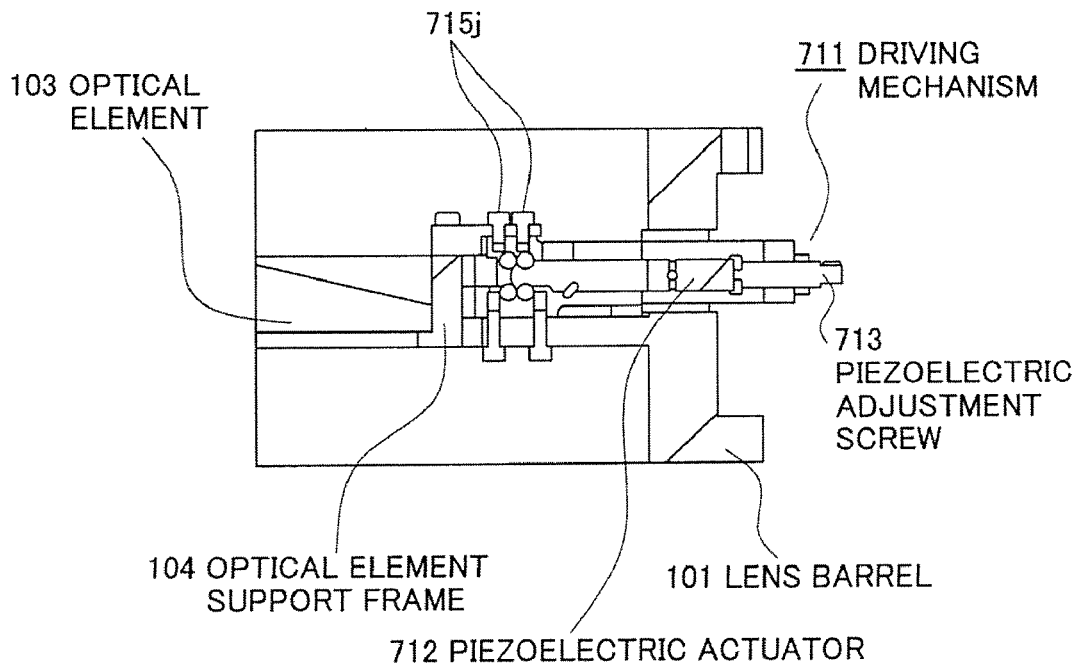

FIG. 24A is a detailed plane view (partially sectional view) of the driving mechanism 711 and the sensor 102, and FIG. 24B is a sectional view.

As illustrated, the driving mechanism 711 is arranged in an approximately radial direction to the optical axis of the lens 103. In order to make the lens barrel 101 compact and lightweight, and in order to improve the maintainability of the actuator of the driving mechanism (such as a replacement and an adjustment when the piezoelectric actuator is damaged or shifted), part of the barrel is perforated.

In order to measure a displacement amount of the driving mechanism 711 and to realize a desired surface deformation of the optical element, the sensor 102 that measures a displacement amount by the driving mechanism 711 is arranged near the driving mechanism 711. The sensor 102 is a means for detecting a displacement of a lens frame in the optical-axis direction, and is properly selected, for example, from an interferometer type distance measuring unit using a semiconductor laser, an electrical capacitance sensor, a linear encoder, a differential transformer displacement sensor, and an eddy-current displacement sensor.

Thus, the seventh embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism.

In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Eighth Embodiment

Figure 25A:
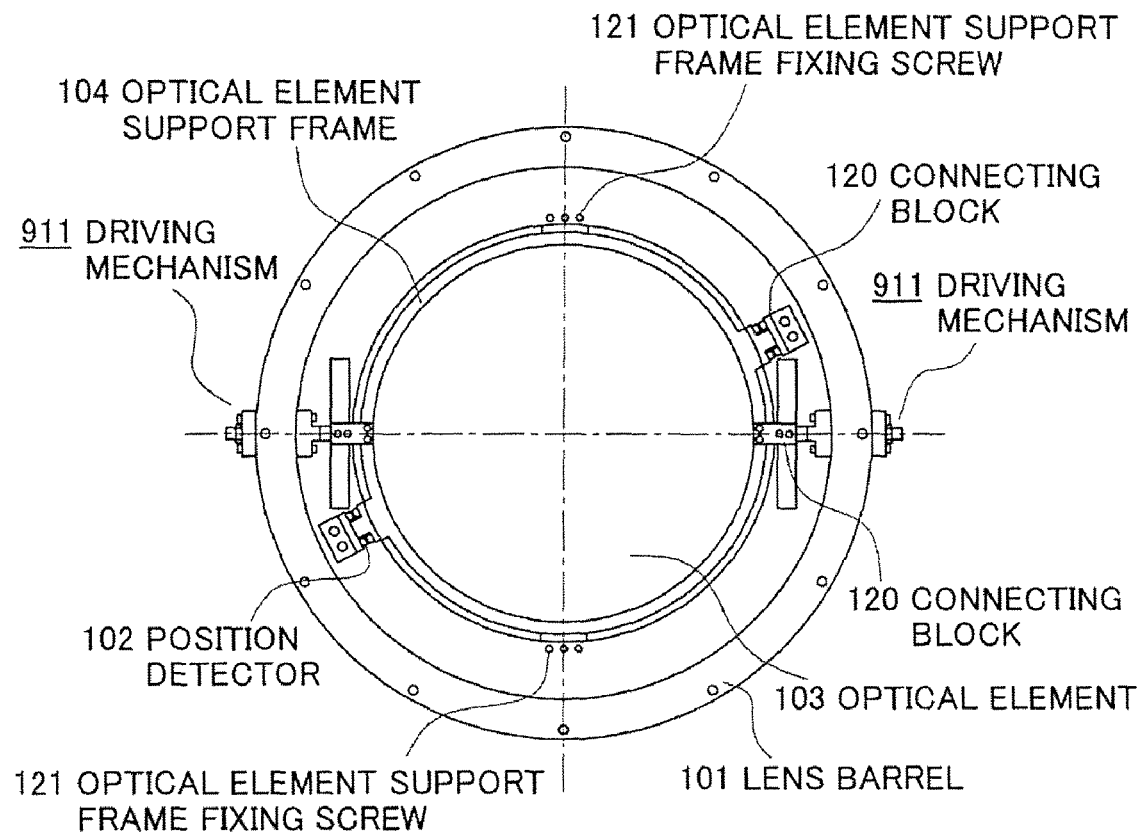
FIGS. 25A-B show an illustrative structure that applies the driving mechanism according to an eighth embodiment of the present invention to an optical-element deforming mechanism.
Figure 25B:
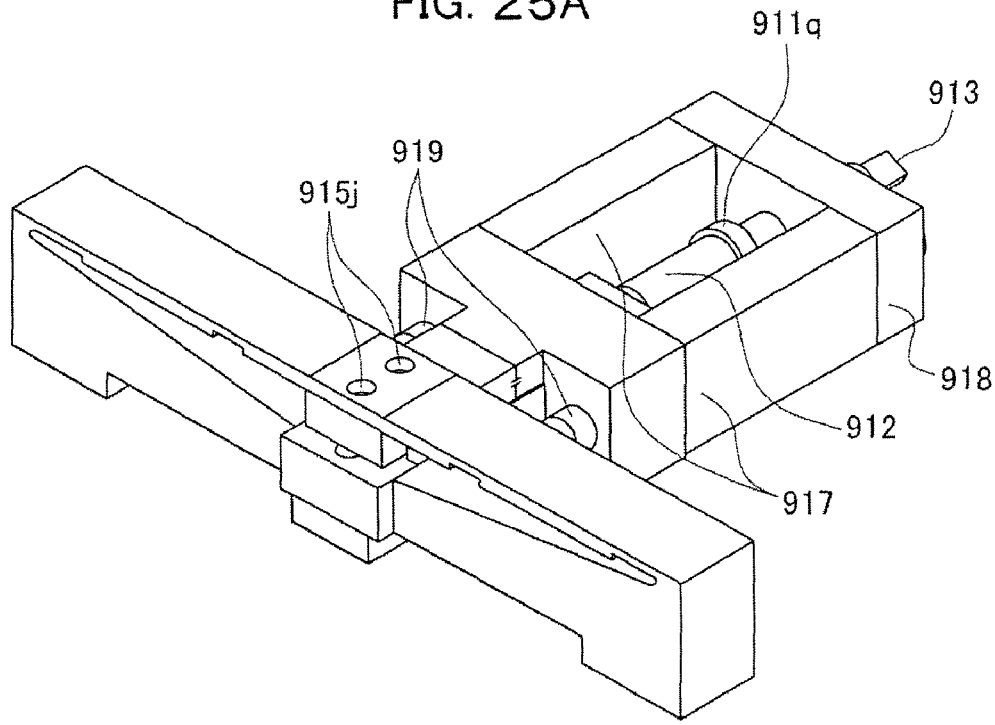

FIGS. 25A-B show an illumination that applies the driving mechanism 311 of the third embodiment to the apparatus that deforms the optical element, in particular, the lens surface.

A driving mechanism 911 may use the mechanism 311 of the third embodiment. However, a displacement amount necessary to deform the lens becomes smaller than that of the third embodiment (which is a mechanism that changes an orientation of the optical element), and the piezoelectric actuator 712 as an input source can use a shorter type than the third embodiment. As a result, the holder end 918 requires no additional spring and coupling with a lens barrel that are necessary for the mechanism of the third embodiment. When the mechanism has such a low rigidity that the optical element is resonated relative to the disturbance oscillation, the additional spring and coupling with the lens barrel are necessary.

FIG. 25B is a perspective view of the driving mechanism body 911 according to the eighth embodiment of the present invention. 911 denotes a driving mechanism body, forming a link mechanism made from a metal block by the wire electric discharge and milling. 912 denotes a stacked piezoelectric actuator, and sealed in a closed cylindrical vessel that has a stretchable driving source that alternately layers the electrostrictive strain elements and electrodes, similar to the piezoelectric actuator 112 of the first embodiment. An overall length of the actuator 912 in the Y-axis direction increases approximately in proportion to the applied voltage. 913 is an adjustment screw that corrects a size error of the actuator 912, and pressurizes the actuator 912. The adjustment screw 913 is inserted between the holder end 918 and the actuator 912. A nut fixes the adjustment screw. As shown in FIGS. 25A-B, an attachment to the lens barrel 101 only with part of the bottom surface of the driving mechanism 911 enables the driving force of the actuator to transmit to the lens barrel 101, mitigating an unnecessary deformation and an erroneous output of the sensor 102.

The third embodiment mitigates a detrimental moment to the piezoelectric actuator by coupling the piezoelectric actuator with the driving mechanism via the piezoelectric receiver links 311q and 311r having the elastic hinge. This embodiment couples the driving mechanism 711 with one end of the piezoelectric actuator 912 via a steel ball (not shown). Like the third embodiment, coupling with the piezoelectric receiver links 311q and 311r may be used.

FIG. 25A shows an illumination that applies the driving mechanism 911 to the optical-element surface deformation apparatus for a 2θ component correction. Two driving mechanisms 911 are arranged to the lens barrel 101 around the optical axis at regular intervals of about 180°, and the output part is fastened onto the lens frame 104 that supports the lens 103. The lens frame 104 is fastened onto the lens barrel 101 by the optical-element inner-ring fixing screw 121 at positions that rotates by 90° around the optical axis to the driving mechanism 911, or at two locations. When the output parts of the two driving mechanisms 911 displace by the same amount in a direction almost along the optical axis, the lens 103 deforms or bends around the Y axis.

In order to correct a higher order, such as a 3θ component and a 4θ component, as described in the sixth embodiment, the mounting number of driving mechanisms 911 increases with the degree of freedom. An explanation with the drawing will be omitted.

In order to measure the displacement amount of the driving mechanism 911 and to realize a desired surface deformation of the optical element, the sensor 102 that measures a displacement amount by the driving mechanism 911 is arranged near the driving mechanism 911. The sensor 102 is a means for detecting a displacement of a lens frame in the optical-axis direction, and is properly selected, for example, from an interferometer type distance measuring unit using a semiconductor laser, an electrical capacitance sensor, a linear encoder, a differential transformer displacement sensor, and an eddy-current displacement sensor.

Thus, the eighth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism.

In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Ninth Embodiment

Figure 26A:
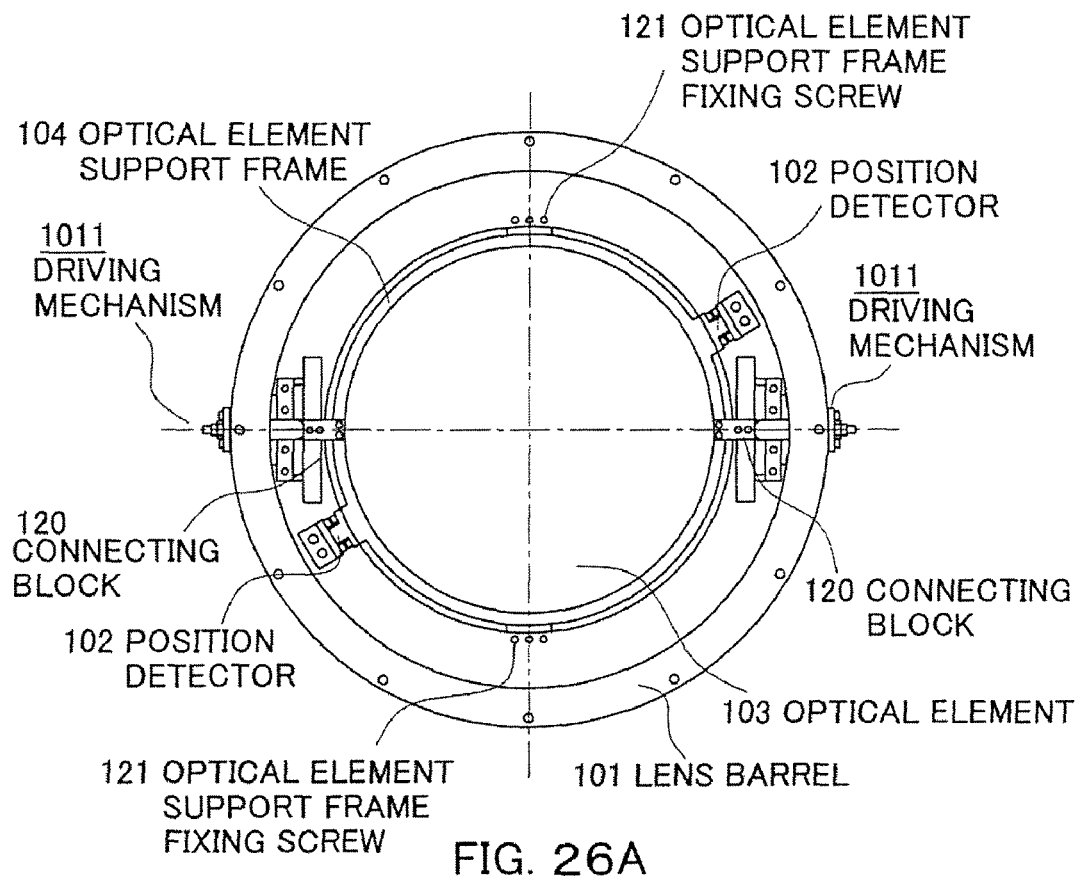
FIGS. 26A-B show an illustrative structure that applies the driving mechanism according to a ninth embodiment of the present invention to an optical-element deforming mechanism.
Figure 26B:
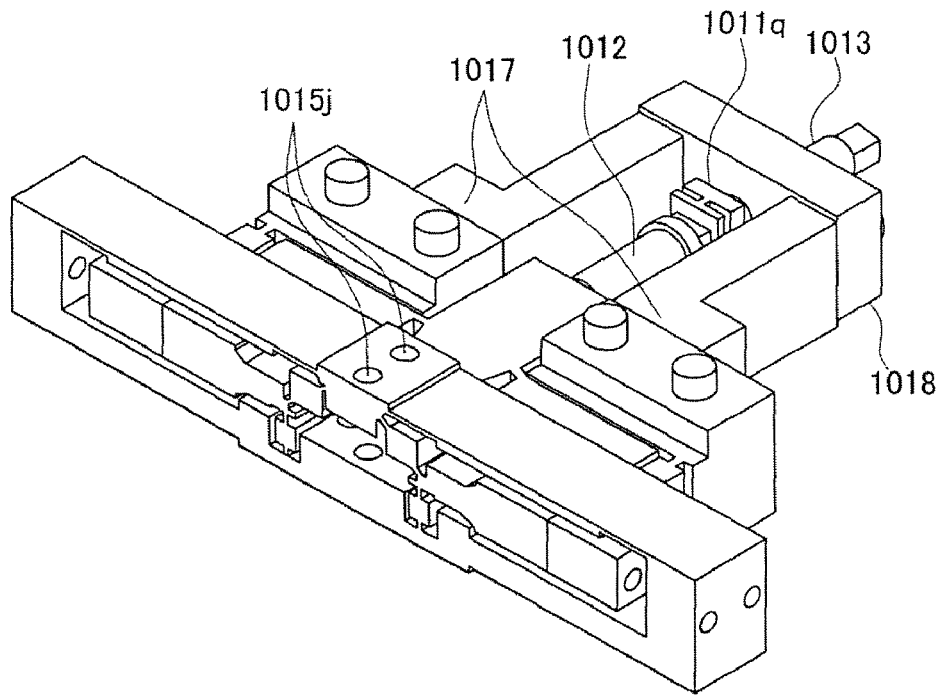

FIGS. 26A-B show an illumination that applies the driving mechanism 411 of the fourth embodiment to the apparatus that deforms the optical element, in particular, the lens surface.

A driving mechanism 1011 may use the mechanism 411 of the fourth embodiment. However, a displacement amount necessary to deform the lens becomes smaller than that of the fourth embodiment (which is a mechanism that changes an orientation of the optical element), and the piezoelectric actuator 712 as an input source can use a shorter type than the fourth embodiment. As a result, the holder end 1018 requires no additional spring and coupling with a lens barrel that are necessary for the mechanism of the fourth embodiment. When the mechanism has such a low rigidity that the optical element is resonated relative to the disturbance oscillation, the additional spring and coupling with the lens barrel are necessary.

FIG. 26B is a perspective view of the driving mechanism body 1011 according to the ninth embodiment of the present invention. 1011 denotes a driving mechanism body, forming a link mechanism made from a metal block by the wire electric discharge and milling. 1012 denotes a stacked piezoelectric actuator, and sealed in a closed cylindrical vessel that has a stretchable driving source that alternately layers the electrostrictive strain elements and electrodes, similar to the piezoelectric actuator 112 of the first embodiment. An overall length of the actuator 1012 in the Y-axis direction increases approximately in proportion to the applied voltage. 1013 is an adjustment screw that corrects a size error of the actuator 1012, and pressurizes the actuator 1012. The adjustment screw 1013 is inserted between the holder end 1018 and the actuator 1012. A nut fixes the adjustment screw. As shown in FIG. 26, an attachment to the lens barrel 101 only with part of the bottom surface of the driving mechanism 1011 enables the driving force of the actuator to transmit to the lens barrel 101, mitigating an unnecessary deformation and an erroneous output of the sensor 102.

The fourth embodiment mitigates a detrimental moment to the piezoelectric actuator by coupling the piezoelectric actuator with the driving mechanism via the piezoelectric receiver links 411q and 411r having the elastic hinge. This embodiment couples the driving mechanism 1011 with one end of the piezoelectric actuator 1012 via a steel ball (not shown). Like the fourth embodiment, coupling with the piezoelectric receiver links 411q and 411r may be used.

FIG. 26A shows an illumination that applies the driving mechanism 1011 to the optical-element surface deformation apparatus for a 2θ component correction. Two driving mechanisms 1011 are arranged to the lens barrel 101 around the optical axis at regular intervals of about 180°, and the output part is fastened onto the lens frame 104 that supports the lens 103. The lens frame 104 is fastened onto the lens barrel 101 by the optical-element inner-ring fixing screw 121 at positions that rotates by 90° around the optical axis to the driving mechanism 1011, or at two locations. When the output parts of the two driving mechanisms 1011 displace by the same amount in a direction almost along the optical axis, the lens 103 deforms or bends around the Y axis.

In order to correct a higher order, such as a 3θ component and a 4θ component, as described in the sixth embodiment, the mounting number of driving mechanisms 1011 increases with the degree of freedom. An explanation with the drawing will be omitted.

In order to measure the displacement amount of the driving mechanism 1011 and to realize a desired surface deformation of the optical element, the sensor 102 that measures the displacement amount by the driving mechanism 1011 is arranged near the driving mechanism 1011. The sensor is a means for detecting a displacement of a lens frame in the optical-axis direction, and is properly selected, for example, from an interferometer type distance measuring unit using a semiconductor laser, an electrical capacitance sensor, a linear encoder, a differential transformer displacement sensor, and an eddy-current displacement sensor.

Thus, the ninth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism. In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

Tenth Embodiment

Figure 27A:
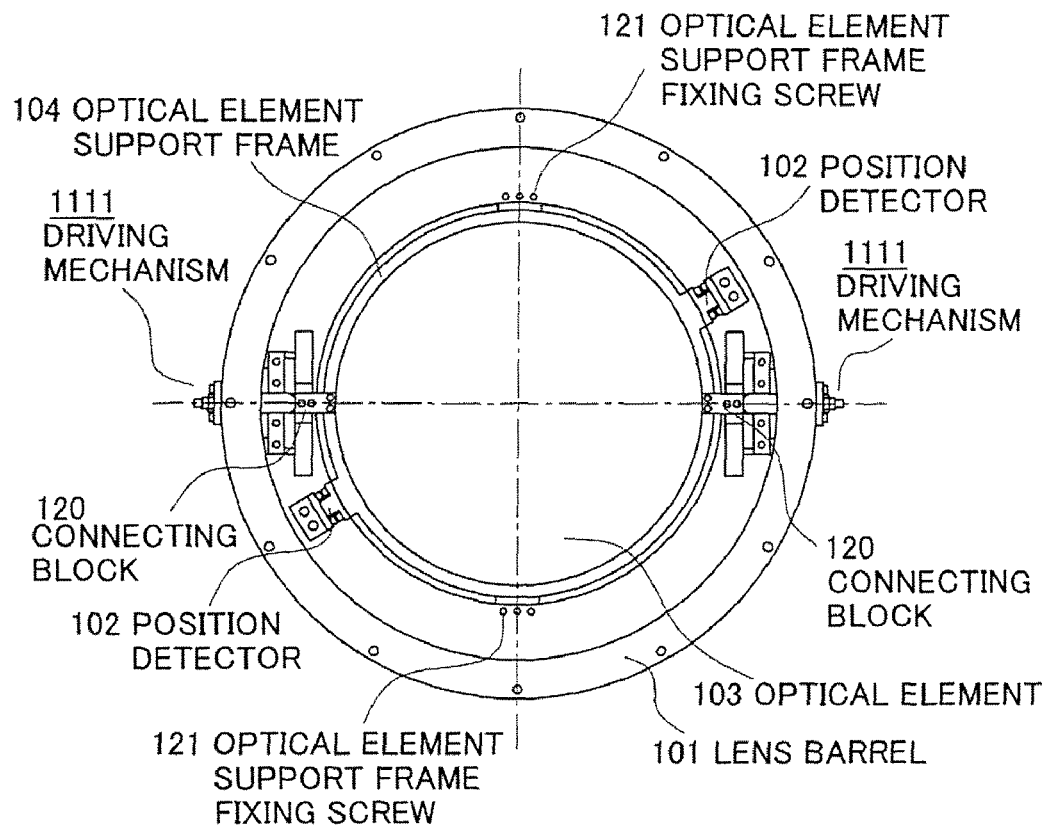
FIGS. 27A-B show an illustrative structure that applies the driving mechanism according to a tenth embodiment of the present invention to an optical-element deforming mechanism.
Figure 27B:
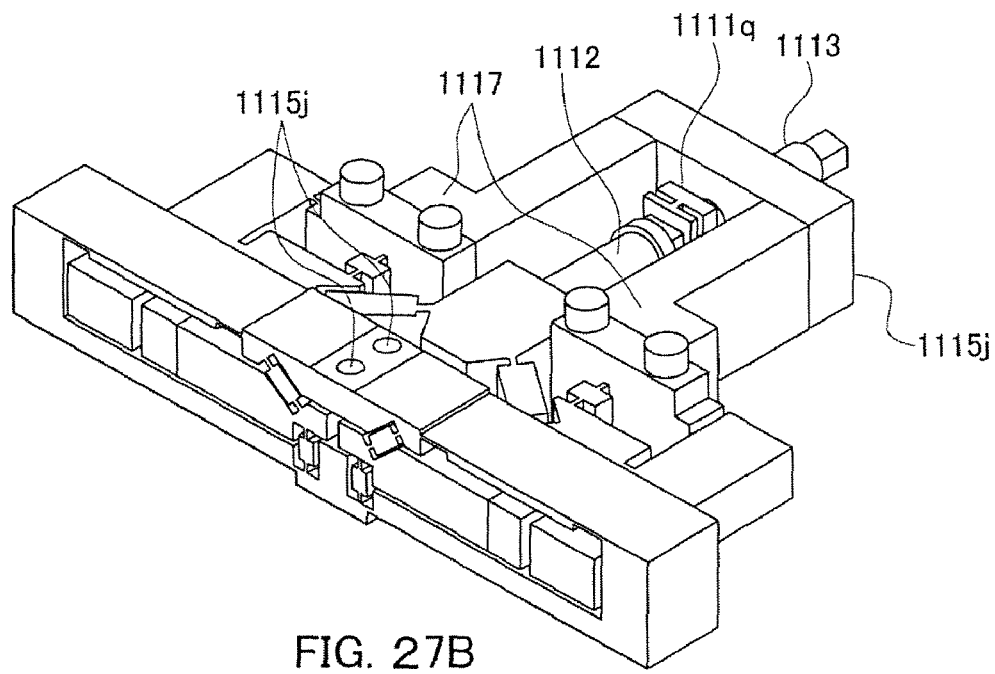

FIGS. 27A-B show an illumination that applies the driving mechanism 511 of the fifth embodiment to the apparatus that deforms the optical element, in particular, the lens surface.

A driving mechanism 1111 may use the mechanism 511 of the fifth embodiment. However, a displacement amount necessary to deform the lens becomes smaller than that of the fifth embodiment (which is a mechanism that changes an orientation of the optical element), and the piezoelectric actuator 712 as an input source can use a shorter type than the fifth embodiment. As a result, the holder end 1118 requires no additional spring and coupling with a lens barrel in the mechanism of the fifth embodiment. When the mechanism has such a low rigidity that the optical element is resonated relative to the disturbance oscillation, the additional spring and coupling with the lens barrel are necessary.

FIG. 27B is a perspective view of the driving mechanism body 1111 according to the tenth embodiment of the present invention. 1111 denotes a driving mechanism body, forming a link mechanism made from a metal block by the wire electric discharge and milling. 1112 denotes a stacked piezoelectric actuator, and sealed in a sealing cylindrical vessel that has a stretchable driving source that alternately layers the electrostrictive strain elements and electrodes, similar to the piezoelectric actuator 112 of the first embodiment. An overall length of the actuator 1112 in the Y-axis direction increases approximately in proportion to the applied voltage. 1113 is an adjustment screw that corrects a size error of the actuator 1112, and pressurizes the actuator 1112. The adjustment screw 1113 is inserted between the holder end 1118 and the actuator 1112. A nut fixes the adjustment screw. As shown in FIG. 27, an attachment to the lens barrel 101 only with part of the bottom surface of the driving mechanism 1111 enables the driving force of the actuator to transmit to the lens barrel 101, mitigating an unnecessary deformation and an erroneous output of the sensor 102.

The fifth embodiment mitigates a detrimental moment to the piezoelectric actuator by coupling the piezoelectric actuator with the driving mechanism via the piezoelectric receiver links 511q and 511r having the elastic hinge. This embodiment couples the driving mechanism 1011 with one end of the piezoelectric actuator 1112 via a steel ball (not shown). Like the fifth embodiment, coupling with the piezoelectric receiver links 511q and 511r may be used.

FIG. 27A shows an illumination that applies the driving mechanism 1111 to the optical-element surface deformation apparatus for a 2θ component correction. Two driving mechanisms 1111 are arranged to the lens barrel 101 around the optical axis at regular intervals of about 180°, and the output part is fastened onto the lens frame 104 that supports the lens 103. The lens frame 104 is fastened onto the lens barrel 101 by the optical-element inner ring fixture screw 121 at positions that rotates by 90° around the optical axis to the driving mechanism 1111, or at two locations. When the output parts of the two driving mechanisms 1111 displace by the same amount in a direction almost along the optical axis, the lens 103 deforms or bends around the Y axis.

In order to correct a higher order, such as a 3θ component and a 4θ component, as described in the sixth embodiment, the mounting number of driving mechanisms 1111 increases with the degree of freedom. An explanation with the drawing will be omitted.

In order to measure the displacement amount of the driving mechanism 1111 and to realize a desired surface deformation of the optical element, the sensor 102 that measures the displacement amount by the driving mechanism 1111 is arranged near the driving mechanism 1011. The sensor 102 is a means for detecting a displacement of a lens frame in the optical-axis direction, and is properly selected, for example, from an interferometer type distance measuring unit using a semiconductor laser, an electrical capacitance sensor, a linear encoder, a differential transformer displacement sensor, and an eddy-current displacement sensor.

Thus, the tenth embodiment provides the following effects:

A linear actuator, such as a stacked piezoelectric actuator, is apart from a final output part of the link mechanism that changes a direction of a displacement, or located at a position that is easy to access from the outside of the lens barrel. Thereby, in the optical-element driving mechanism that arranges plural driving mechanisms around the optical element, the linear actuator is located almost outermost the lens barrel. This configuration facilitates the maintenance, such as a replacement, and provides a thin driving mechanism. In addition, the approximately symmetrical link mechanism can minimize a displacement of the final output displacement part in an unintentional direction.

Since the displacement pickup link that contacts the actuator provides a translational motion and no rotational displacements, the actuator generates no deformation stresses in a bending direction and can avoid damages.

The output displacement pickup member of the actuator and the direction conversion member of the picked direction are manufactured as separate members, and the thickest part of the link mechanism is made as thin as the height of the actuator. This configuration provides a thin driving mechanism having a shortened size in the final output displacement direction.

A single hole in the lens-barrel side surface which provides an access from the outside provides an effect of maintaining the rigidity of the lens barrel as high as possible.

A thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

The above embodiments use a stacked piezoelectric actuator that changes its overall length, but may use another driver, such as a precise direct-acting mechanism that combines a motor and a ball screw, and a fluid sealing arrangement (e.g., hydraulic or pneumatic cylinder, and bellows).

Each embodiment can provide a thin driving mechanism that is not so thick in the driving-axis direction can install more driving mechanism units, providing an optical system having a high imaging performance. The actuator as a driving source arranged outside the lens barrel can facilitate the maintenance of the actuator, such as a replacement and an adjustment, when the actuator fluctuates due to an unexpected breakdown and shift.

This application claims a foreign priority benefit based on Japanese Patent Application No. 2007-040005, filed on Feb. 20, 2007, which is hereby incorporated by reference herein in its entirety as if fully set forth herein.

What is claimed is:

1. An optical-element driving mechanism configured to drive an optical element, said optical-element driving mechanism comprising a plurality of uniaxial driving mechanisms that include a linear actuator that displaces a driving part in a tangential direction of the optical element, a first link mechanism that magnifies a displacement of the driving part in the linear actuator, and a second link mechanism that converts the displacement, which is magnified in the tangential direction by the first link mechanism, in an optical-axis direction of the optical element, which is orthogonal to the tangential direction, the linear actuator being level with the first and second link mechanisms in the optical-axis direction, and the uniaxial driving mechanism being arranged in order of the second link mechanism, the first link mechanism and the linear actuator in a radial direction when viewed from the optical axis of the optical element.

2. An optical-element driving mechanism according to claim 1, wherein three uniaxial driving mechanisms are arranged at intervals of 120° around the optical axis, and an output part of each uniaxial driving mechanism is coupled with the optical element or a support member of the optical element.

3. An optical-element driving mechanism according to claim 1, wherein the link mechanism uses an elastic hinge as a rotational joint.

4. An optical-element driving mechanism according to claim 1, further comprising plural measurement units each configured to measure a position of the optical element or a support member of the optical element.

5. An optical-element driving mechanism according to claim 4, further comprising a controller configured to position the optical element at a position that provides an accurate imaging relationship, based on a value of the plural measurement units.

6. An optical-element driving mechanism according to claim 1, wherein two uniaxial driving mechanisms are arranged at intervals of 180° around the optical axis, and an output part of each uniaxial driving mechanism is coupled with the optical element or a support member of the optical element, the optical element or the support member is fixed onto a lens barrel at a two positions that provides a phase shift by 90° to the two driving mechanism.

7. An optical-element driving mechanism according to claim 1, wherein the uniaxial driving mechanism has a geometric magnification between 0.7 and 2.

* * * * *